US008641229B2

(12) United States Patent
Li

(10) Patent No.: US 8,641,229 B2
(45) Date of Patent: Feb. 4, 2014

(54) WATERPROOF FLEXIBLE AND RIGID LED LIGHTING SYSTEMS AND DEVICES

(75) Inventor: Qing (Charles) Li, Blacksburg, VA (US)

(73) Assignee: Virginia Optoelectronics, Inc., Blacksburg, VA (US)

( * ) Notice: Subject to any disclaimer, the term of this patent is extended or adjusted under 35 U.S.C. 154(b) by 195 days.

(21) Appl. No.: 12/975,112

(22) Filed: Dec. 21, 2010

(65) Prior Publication Data

US 2012/0002417 A1     Jan. 5, 2012

Related U.S. Application Data

(63) Continuation-in-part of application No. 12/499,306, filed on Jul. 8, 2009, now Pat. No. 8,262,250.

(60) Provisional application No. 61/079,042, filed on Jul. 8, 2008, provisional application No. 61/288,815, filed on Dec. 21, 2009.

(51) Int. Cl.
  *F21S 4/00* (2006.01)
(52) U.S. Cl.
  USPC ........... 362/219; 362/225; 362/267; 362/652; 362/657
(58) Field of Classification Search
  USPC ................. 362/219, 221–223, 225, 311.02, 362/311.03, 311.04, 267, 310, 311.15, 362/249.02, 249.04, 249.08
  See application file for complete search history.

(56) References Cited

U.S. PATENT DOCUMENTS

| 2,414,866 | A | 1/1947 | Henry |
| 4,173,035 | A | 10/1979 | Hoyt |
| 4,479,686 | A | 10/1984 | Hoshino et al. |
| 5,107,408 | A | 4/1992 | Vernondier |

(Continued)

FOREIGN PATENT DOCUMENTS

| CN | 201000001 Y | 1/2008 |
| CN | 201021793 Y | 2/2008 |
| CN | 201053600 Y | 4/2008 |
| CN | 201145159 Y | 11/2008 |

OTHER PUBLICATIONS

Co-pending U.S. Appl. No. 12/499,306, filed Jul. 8, 2009.
Co-pending U.S. Appl. No. 13/106,558, filed May 12, 2011.

(Continued)

*Primary Examiner* — Thomas Sember
(74) *Attorney, Agent, or Firm* — New River Valley IP Law; Michele L. Mayberry

(57) ABSTRACT

The present invention relates to lighting strips and more particularly to flexible lighting systems and devices, which are waterproof. The lighting strips are modular and are capable of being physically and electrically connected with one another to provide lighting systems that are waterproof and adaptable to many situations. Included in embodiments of the invention are modular lighting strips comprising: a non-conductive substrate strip comprising an electrical circuit; a plurality of high brightness LEDs operably connected to the electrical circuit; a colloid layer comprising polyurethane resin providing a waterproof coating over the substrate, the circuit, and the LEDs; and a plug at one end and a socket at an opposing end of the substrate which is integrally formed with the strip to provide for waterproof electrical interconnection of two or more circuits or to a power supply. The lighting strips of the invention can be used in particular for back lighting, accent lighting, aisle or path lighting, contour lighting, elegant interior decoration, holiday decorations, or landscape lighting.

7 Claims, 24 Drawing Sheets

(56) References Cited

U.S. PATENT DOCUMENTS

| | | |
|---|---|---|
| 5,342,221 A | 8/1994 | Peterson |
| 5,559,681 A | 9/1996 | Duarte |
| 5,644,839 A | 7/1997 | Stone |
| 5,788,520 A | 8/1998 | Roche |
| 5,848,837 A | 12/1998 | Gustafson |
| 5,944,547 A | 8/1999 | Golab et al. |
| 6,050,850 A | 4/2000 | Crane, Jr. et al. |
| 6,210,189 B1 | 4/2001 | Gantt |
| 6,257,925 B1 | 7/2001 | Jones |
| 6,273,587 B1 | 8/2001 | Demshki |
| 6,341,875 B1 | 1/2002 | Chu |
| 6,394,623 B1 | 5/2002 | Tsui |
| 6,579,107 B1 | 6/2003 | Sanroma |
| 6,673,293 B1 | 1/2004 | Mistopoulos et al. |
| 6,796,680 B1 * | 9/2004 | Showers et al. ............... 362/246 |
| 6,814,583 B1 | 11/2004 | Young et al. |
| 6,893,144 B2 | 5/2005 | Fan |
| 7,083,455 B1 | 8/2006 | Miura et al. |
| 7,101,188 B1 | 9/2006 | Summers et al. |
| 7,114,247 B2 | 10/2006 | Swantner et al. |
| 7,137,849 B2 | 11/2006 | Nagata |
| 7,210,818 B2 | 5/2007 | Luk et al. |
| 7,264,374 B1 | 9/2007 | Spika |
| 7,374,457 B1 | 5/2008 | Oksengendler et al. |
| 7,703,941 B2 | 4/2010 | Lee |
| 7,771,204 B2 | 8/2010 | Stoyan |
| 8,200,861 B2 | 6/2012 | Davis et al. |
| 2004/0252500 A1 | 12/2004 | Lin |
| 2008/0094828 A1 | 4/2008 | Shao |
| 2009/0091945 A1 * | 4/2009 | Joseph ..................... 362/555 |
| 2010/0118532 A1 | 5/2010 | Liang et al. |

OTHER PUBLICATIONS

Flex Connectors User's Guide, Osram Sylvania, Oct. 2007.

* cited by examiner

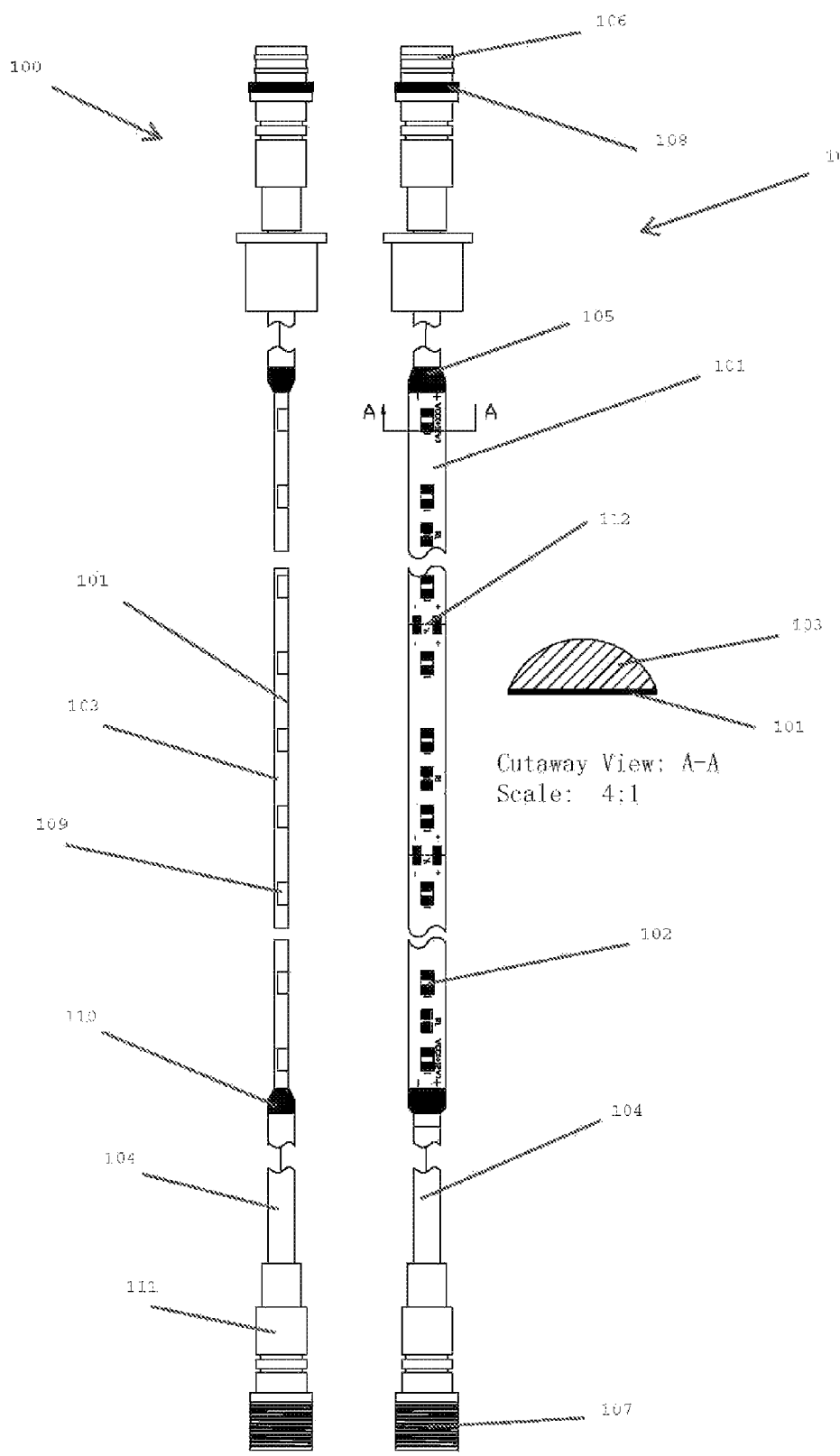

FIG. 3A  FIG. 3B 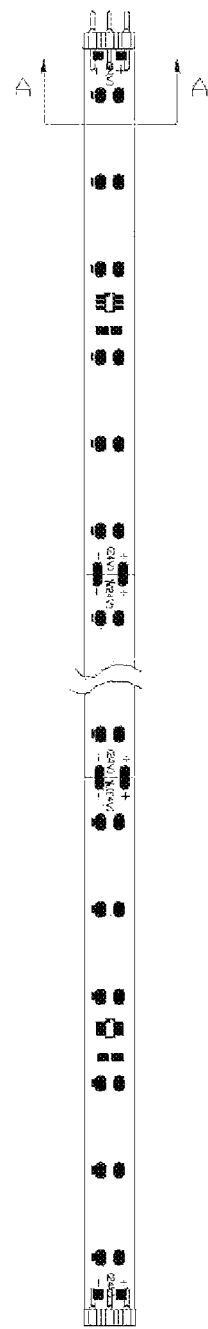
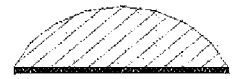
View A-A

FIG. 4A  FIG. 4B
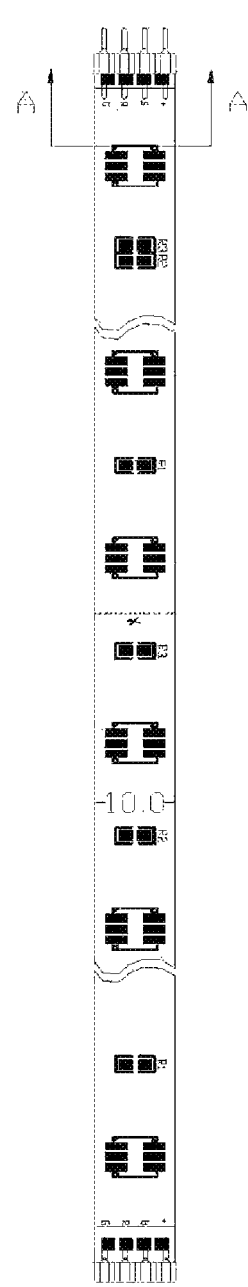
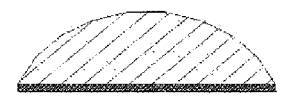
View A-A

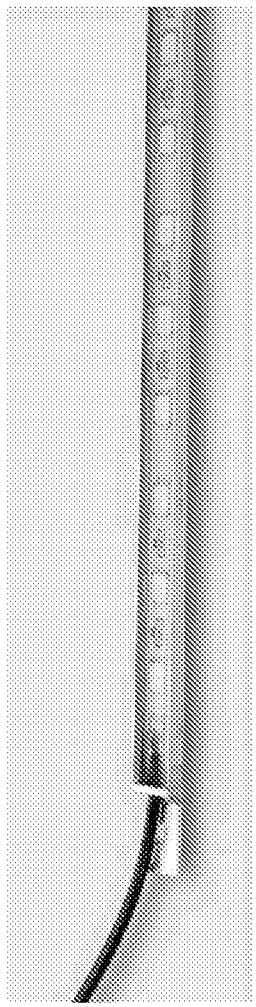

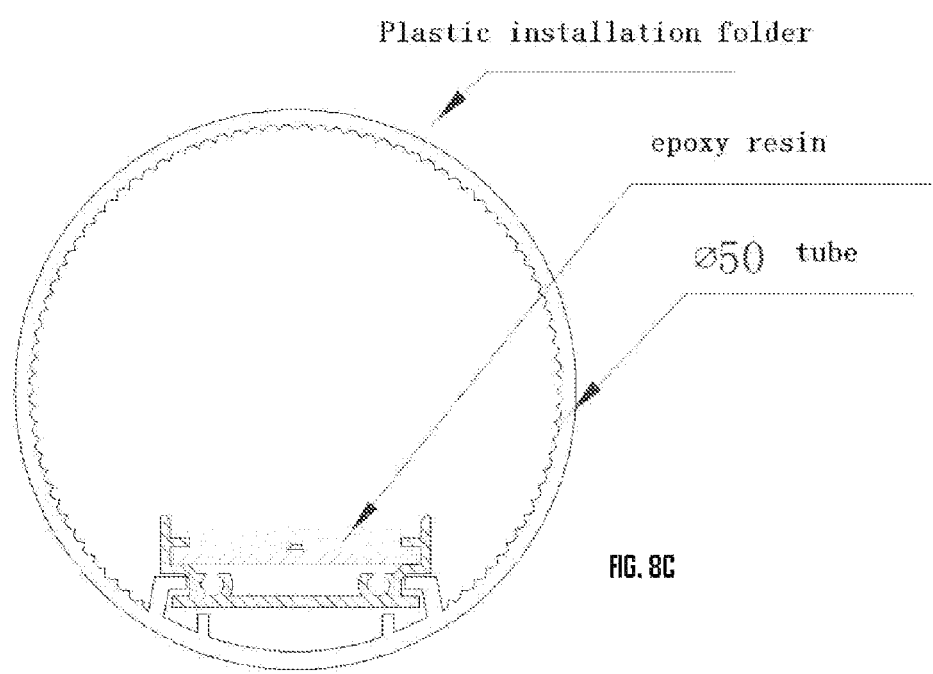

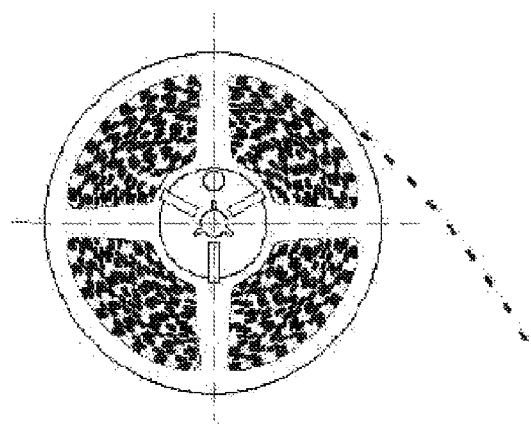
FIG. 11A
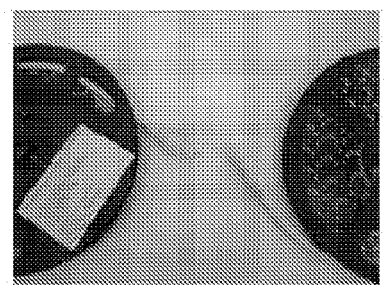 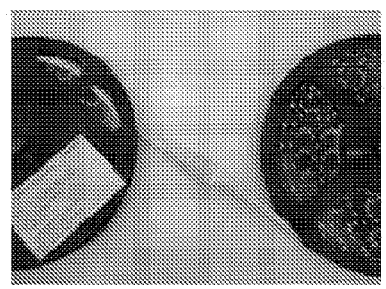
FIG. 11B    FIG. 11C

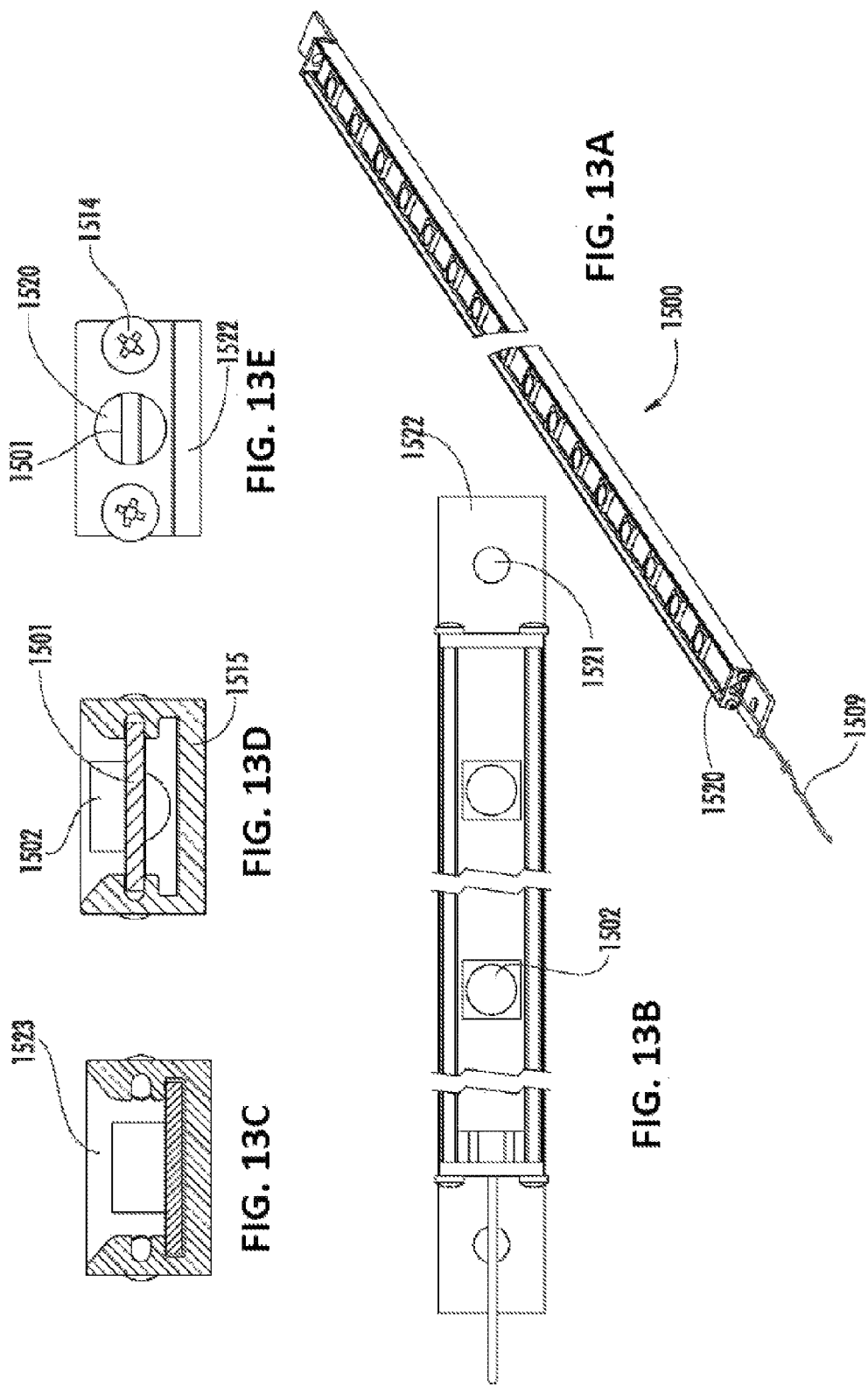

WATERPROOF FLEXIBLE AND RIGID LED LIGHTING SYSTEMS AND DEVICES

CROSS-REFERENCE TO RELATED APPLICATIONS

This application is a Continuation-in-Part of U.S. application Ser. No. 12/499,306, filed Jul. 8, 2009 now U.S. Pat. No. 8,262,250, which claims priority to and the benefit of the filing date of U.S. Application No. 61/079,042, filed Jul. 8, 2008; and this application claims priority to and the benefit of the filing date of U.S. Application No. 61/288,815, filed Dec. 21, 2009, the disclosures of each of which are hereby incorporated by reference herein in their entireties.

BACKGROUND OF THE INVENTION

1. Field of the Invention

The present invention relates to lighting strips and more particularly to flexible or rigid lighting systems and devices, which are waterproof. The lighting strips are modular and are capable of being physically and electrically connected with one another to provide lighting systems that are waterproof and adaptable to many situations.

2. Description of the Related Art

Waterproof modular strip lighting is highly desirable for numerous applications, including as decorative lighting in exterior settings or interior setting where moisture is common, such as bathrooms, bars, and kitchens. In exterior settings, it is common for installed lighting devices to be exposed to the elements, such as rain, condensation, humidity, or other moisture, as well as extreme temperatures. Lighting devices exposed to moisture and/or extreme temperatures, however, is often at risk for failure. If moisture, especially water droplets, is allowed to contact non-waterproof lighting devices, the water can cause a short circuit or other electrical failure of the device, requiring repair and/or replacement of the failed components.

Waterproofing materials of existing lighting devices typically include as a waterproof colloid layer an epoxy resin for covering the LEDs, electrical circuits and connections, and the substrate. In some cases in existing devices, the epoxy resin or colloid layer does not cover the surface of the LEDs to avoid compromising the light output. By not covering the LEDs, however, there is an increased chance of moisture being introduced into the system where the colloid layer meets the LEDs. This is especially applicable in flexible designs where adherence between the colloid layer and the side of an LED may come loose enough to allow moisture into the system if the strip is flexed repeatedly. Further, in some situations, epoxy resin as colloid layer has been found to be inadequate, such as in extreme temperature situations, including in external weather or environmental conditions or due to the use of high brightness LEDs, which typically have a high heat output during operating of such devices. Under extreme low or high temperatures epoxy resin can craze or become discolored or cloudy, leading to cracks in the waterproof barrier and a decrease in the amount of light output from the device. Better waterproofing materials and techniques are thus desired.

Further, strip lighting that is easy and convenient to install is also highly desirable, especially lighting devices that can be adaptable to various situations. For example, lighting strips that are waterproof, are configured to be cut to a desired length during installation, minimize the number of electrical junctures for a lighting strip system, can be cut and re-connected by way of a waterproof connector, and/or are adaptable to remain waterproof after cutting would be highly desirable, however, existing lighting strip devices and assemblies do not satisfy this need.

What are needed are modular, waterproof lighting systems that are easy and quick to install and repair, and/or provide less opportunity for lighting system failures by providing fewer electrical and physical breaks in the circuit of the lighting system, and/or provide for high brightness output of the LEDs, and/or provide for custom fitting of a lighting system to a particular situation while remaining waterproof.

SUMMARY OF THE INVENTION

In light of the problems described above, embodiments of the present invention provide waterproof flexible and rigid strip lighting devices that can be combined and conveniently interconnected to form waterproof modular lighting systems. Waterproof, as used in this application, includes devices and systems which may be less than completely waterproof, such as moisture resistant.

Embodiments of the invention include waterproof flexible and rigid lighting strips that are additionally readily adaptable at the time of installation for various applications and can be repaired quickly and easily when light source failures occur or changes to the lighting system are desired. Such devices and systems can be re-configured for particular situations without compromising the integrity of the waterproof or moisture resistant characteristics.

Portions of the waterproof lighting systems can be replaced should one or more LEDs fail. Simply, a portion of the lighting strip can be cut at predetermined segments and replaced with a new segment having waterproof connectors for interconnecting with the installed lighting strip. Thus, repairs to portions of the installed devices can be made quickly and easily without replacing the entire lighting system and without jeopardizing the waterproof nature of the strips. Similarly, such modifications can be made when necessitated by relocation of a lighting system from one location to another more desirable location.

Included in embodiments of the invention are flexible or rigid modular lighting strips comprising: a non-conductive substrate strip comprising an electrical circuit; a plurality of high brightness LEDs operably connected to the electrical circuit; a colloid coating covering exposed surfaces of the substrate and circuit, and partially or completely covering exposed surfaces of the LEDs; and a plug at one end and a socket at an opposing end of the substrate which is integrally formed, or otherwise operably connected, with the strip to provide for waterproof electrical interconnection of two or more circuits or to a power supply.

Embodiments of the invention can comprise latch-type securing mechanisms, preferably releasable, for securing the connection between lighting strips when installed, allowing for convenient disengagement of the components for repairs, and/or allowing for a waterproof or water resistant system.

Included in embodiments of the invention are modular lighting strips comprising: a non-conductive substrate strip comprising an electrical circuit; a plurality of high brightness LEDs operably connected to the electrical circuit; a colloid layer comprising polyurethane resin providing a waterproof coating over the substrate, the circuit, and the LEDs; and a plug at one end and a socket at an opposing end of the substrate which is integrally formed with the strip to provide for waterproof electrical interconnection of two or more circuits or to a power supply. Embodiments of the invention can comprise a latch-type securing mechanism, preferably releasable, for securing the connection between lighting strips when installed but also allowing for convenient disengagement of the components for repairs.

Embodiments of the flexible and rigid lighting systems and devices can comprise a colloid waterproofing layer covering all, most, or some of the device or system. For example, when waterproof LEDs are used the colloid layer need only be applied on the substrate and circuit and contacting or completely covering one or more, all, or less than all surfaces of the waterproof LEDs. A preferred embodiment includes applying the colloid layer to cover the substrate and circuit and a portion of the sides of the LEDs that are typically perpendicular to the substrate, rather than also covering the top of the LED with the colloid layer as well, or only so much of the top of the LED as may be needed to render the lighting device or system waterproof. This may minimize materials costs as well as manufacturing time needed for ensuring a thinner layer of colloid material has set. Waterproofing or making water resistant as much of the devices and systems as possible is preferred.

The modular lighting strips of embodiments of the invention can comprise a printed circuit board, such as a flexible printed circuit board, as the substrate strip and electrical circuit. The overall lighting strip can be flexible or inflexible depending on the materials used for construction. For example, the lighting strips can comprise a printed circuit board (PCB) on an inflexible or flexible material, wherein the PCB is supported or not supported by a rigid material, such as a support with heat sink capabilities. Preferably, the waterproof lighting strips are flexible.

Further included in the invention are modular lighting strips having a low profile appearance, for example, with a height of less than about 3 mm, or having LEDs that have a height of about 3 mm or less.

It is also possible to cut the modular lighting strips of embodiments of the invention. For example, if desired, it is possible to cut a strip at the time of installation, to provide a length of strip lighting that is less than the length of the modular segment provided in whole. Likewise, the strips can be cut to provide for fewer LEDs than are installed on the entire strip. Cutting can be readily performed, such as at the time of installation of the device(s) and a terminal can be installed at the cut end to maintain the waterproof nature of the strip. Such adaptability and modularity is especially applicable to the flexible lighting devices and systems of the invention but these features are equally applicable to rigid lighting systems and devices as well.

The lighting strips according to embodiments of the invention can be configured so as to provide plug-type ends to the strip at the point of cutting, for example, by providing intermediate electrical contacts at one or more positions along the length of the strip which can be cut to provide two ends each having plug-type electrical contacts which can be operably connected to a socket, upon exposing the electrical contacts at the cut end of the substrate by removing a portion of the colloid layer. The lighting strips can also be cut at any point along the strip where there is no intermediate electrical contact to provide a terminal end of the circuit and waterproofed.

Preferred are modular lighting strips described herein which are about 1 foot in length, and/or comprise up to about 18 LEDs, such as 6, 9, or 18 LEDs, and/or are capable of being operably interconnected with one another to provide up to about 540 light sources from one electrical power supply. The flexible lighting strips can further be interconnected and provided on reels to increase the convenience of installation. Exemplary hard or rigid lighting strips of the invention can be of any length, such as 1 foot, or 2, 3, 4, 5, or 6 feet in length and each can comprise, for example, 10 LEDs and can be interconnected with other strips, such as 4 strips, for providing a modular lighting system having up to 10 LEDs, 20 LEDs, 30 LEDs, 40 LEDs and so forth for example up to about 240 LEDs.

Modular lighting system embodiments are also included in the invention. Such lighting systems can comprise: a plurality of modular lighting strips each comprising: a non-conductive substrate strip comprising an electrical circuit; a plurality of high brightness LEDs operably connected to the electrical circuit; a colloid layer comprising polyurethane resin providing a waterproof coating over at least part of each of the substrate, the circuit, and the LEDs; and a plug at one end and a socket at an opposing end of the substrate which operably connected or integrally formed with the strip to provide for waterproof electrical interconnection of two or more circuits.

Means for operably connecting a modular lighting strip to an electrical power supply can be provided by the plug or socket of the lighting strip, wire leads irremovably and operably connected to the lighting strip, or a non-conductive substrate strip comprising an electrical circuit and no light sources which is capable of operably connecting to a lighting strip by way of an integrally formed plug or socket. DC jack adapters can be used, and in the case of multi-color light displays for example the red, green, blue LED lighting strips can comprise an RGB-controller for controlling the timing, duration, and changes in color of the display.

Each modular lighting strip can be configured to be any length, with 1-foot lengths being especially desired. Further, the lighting strips can comprise any number of light sources, such as 6, 9, 10, or 18 LEDs. Such strips are operably interconnectable to provide up to about 30 feet, for example, from about 15-30 feet, of strip lighting capable of being powered by one electrical power supply.

The modular lighting systems can be constructed so that the first PCB is capable of being connected to a power supply by way of a plug, socket, or wire leads irremovably and operably connected to the first PCB.

Further, the modular lighting systems according to embodiments of the invention can comprise about 1-foot long PCBs with LEDs, and/or from about 6-18 LEDs, and/or are operably interconnectable to provide from about 15-30 feet of strip lighting capable of being powered by one electrical power supply.

Any of the modular lighting systems of the invention can be low profile, for example, having a height of less than about 3 mm.

BRIEF DESCRIPTION OF THE DRAWINGS

FIG. 1A shows a side elevation view of one embodiment of a low-profile, flexible, waterproof lighting strip according to the invention.

FIG. 1B shows a top plan view of one embodiment of a low-profile, flexible, waterproof lighting strip according to the invention.

FIG. 3A shows a side elevation view of one embodiment of a low-profile, flexible, waterproof lighting strip according to the invention.

FIG. 3B shows a top plan view of one embodiment of a low-profile, flexible, waterproof lighting strip according to the invention.

FIG. 4A shows a side elevation view of one embodiment of a low-profile, flexible, waterproof lighting strip according to the invention.

FIG. 4B shows a top plan view of one embodiment of a low-profile, flexible, waterproof lighting strip according to the invention.

FIGS. 7A-E are schematic diagrams and photographs of various waterproof rigid lighting strips of the invention.

FIGS. 8A-D are schematic diagrams showing representative cross sections of various waterproof rigid lighting strips of the invention.

FIGS. 11A-C are schematic diagrams showing waterproof flexible lighting strips arranged in a lighting system and prepared for installation on a convenient reel.

FIGS. 13A-E show various views of a rigid waterproof lighting system.

DETAILED DESCRIPTION OF VARIOUS EMBODIMENTS OF THE INVENTION

Reference will now be made in detail to various exemplary embodiments of the invention. The following detailed description is presented for the purpose of describing certain embodiments in detail and is, thus, not to be considered as limiting the invention to the embodiments described. Rather, the true scope of the invention is defined by the claims. Additionally, any features of any embodiment described herein are equally applicable to any other embodiment described herein or envisioned by one of ordinary skill in the art. Thus, the detailed descriptions provided herein should not be construed to exclude features otherwise described with respect to another embodiment.

Figures 2A, 2B:
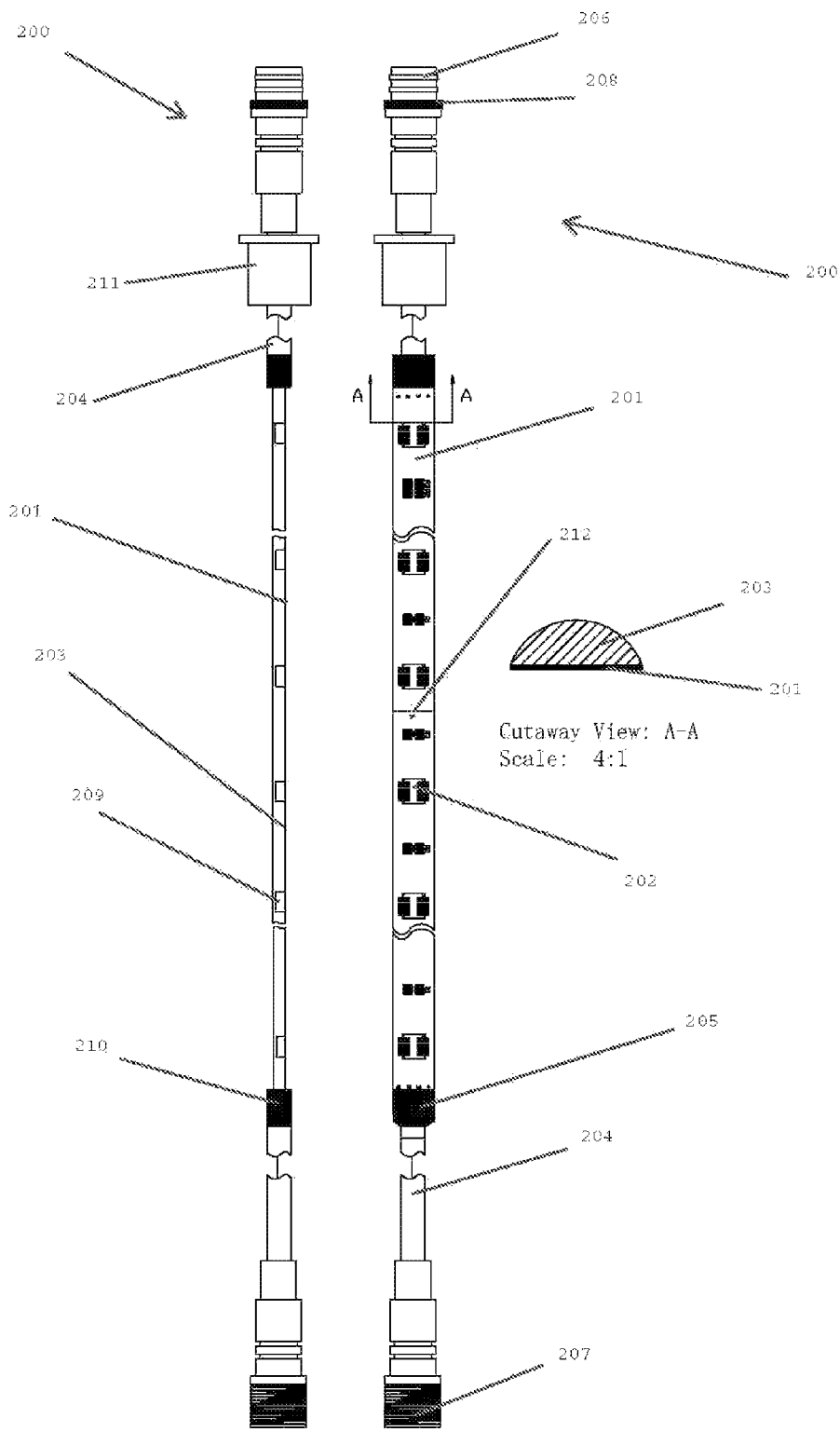
FIG. 2A shows a side elevation view of one embodiment of a low-profile, flexible, waterproof lighting strip according to the invention.
FIG. 2B shows a top plan view of one embodiment of a low-profile, flexible, waterproof lighting strip according to the invention.

FIGS. 1A, 2A, 3A, and 4A show side elevation views of embodiments of flexible, waterproof lighting strips according to the invention. As shown in FIGS. 1A, 2A, 3A an embodiment of a single color waterproof flexible lighting strip (flex strip) 100, 200, 300 is provided. The flex strip 100, 200, 300 comprises a non-conductive substrate strip 101, 201, 301 comprising an electrical circuit (not shown); a plurality of light sources 109, 209, 309 operably connected to the electrical circuit; a socket 111, 211, 311 operably connected to the electrical circuit of the substrate strip 101, 201, 301 at both ends of flex strip 100, 200, 300 in a manner that provides for a waterproof connection, e.g., by way of wire leads encased in waterproof insulation 104, 204 and connected to the substrate by way of waterproof seals 110, 210. As shown in FIGS. 3A and 4A the connectors can be integral with the lighting strips and comprise a plug and socket which are configured to provide a waterproof connection when connected to a corresponding socket or plug of another lighting strip. Coating 103, 203, 303, 403 encapsulates the upper surface of substrate 101, 201, 301, 401 and light sources 109, 209, 309, 409 to provide for waterproof protection of the electrical components (circuit on PCB and wire leads) of the flexible lighting strips 100, 200, 300, 400. In embodiments, the non-conductive substrate strip can be colored to match or complement the color of the surface to which it will be installed to provide a discrete installed lighting system when installed.

As further shown in FIGS. 1B, 2B, 3B, 4B lighting strip 100, 200, 300, 400 comprises a flexible printed circuit board (PCB) 101, 201, 301, 401 which supports electrical contacts 102, 202, 105, 205 and the electrical circuit (only partially shown) of the lighting strip 100, 200, 300, 400. As shown in cross-sections A-A, coating 103, 203, 303, 403 may cover and completely encapsulate the upper surface of PCB 101, 201, 301, 401 to provide waterproof protection for the PCB and in particular the electrical components of the lighting strips, which are part of the PCB and/or which are mounted thereon. Coating 103, 203, 303, 403 may be applied partially or completely to the upper surface of PCB 101, 201, 301, 401 to provide the desired degree of moisture resistance or waterproofing to the system components. For example, the coating 103, 203, 303, 403 may completely cover the PCB 101, 201, 301, 401 and the electrical circuit, contacts, or other electrical components of the devices and partially cover the sides of the LEDs that are perpendicular to the substrate, such as about ¼, ⅓, or ½ of the height of the LEDs. In preferred embodiments, waterproof LEDs are used and/or only enough of the LED is covered to provide waterproof protection to the system. In embodiments, the colloid layer is disposed on the substrate up to a level that is about the level of the upper surface of the LEDs but not covering the LEDs so that light emitted from the device is not affected by the waterproofing material or technique. Such a configuration is applicable to flexible or rigid strip lighting, but will more typically be employed with respect to rigid lighting systems. The waterproofing material can alternatively be disposed in a manner to completely encapsulate the LEDs, by for example covering the entire upper surface of the LEDs.

As shown in cross-sections A-A of FIGS. 1B, 2B, 3B, and 4B, coating 103, 203, 303, 403 forms a rounded profile. Here, coating 103, 203, 303, 403 is a polyurethane resin, which can be applied on the lighting strips in liquid form in a manner to allow for the resin to flow naturally into a rounded profile over the LEDs and substrate. In this embodiment, the polyurethane resin coating 103, 203, 303, 403 is of minimal thickness and just covers the upper surface of the LEDs so as not to interfere with the light output of the LEDs.

One technique for applying the colloid layer is to allow the material to form freely on the surface of the PCB and/or to provide gently rocking of the PCB while the material dries to ensure complete coverage of the components. Molds or guides can also be used to prevent overflow of the liquid colloid material over the edges of the PCB, or to ensure complete coverage of the PCB by the colloid material, or to allow for the application to be performed using a more fluid solution of colloid material. For example, temporary walls can be placed lengthwise along the sides of the PCB to form a temporary cavity within which the LEDs sit on the PCB. Liquid colloid material can then be applied in the cavity and allowed to settle by way of gravity or in combination with gentle rocking of the PCB. Once the colloid material has set in the desired position, the temporary supports, guides, or walls can be removed, leaving a colloid layer on the PCB which has a square or rectangular cross section. Further, for example, the temporary guides can be combined as a single tool, basically forming a structure with two walls disposed at a right angle (or any angle less than 180 degrees) to one another. This tool can then be inverted over the PCB on the side with the LEDs to form a cavity defined by the two walls and the PCB. Liquid or semi-liquid colloid material can then be injected into the cavity and allowed to dry or form on the PCB, circuit, and or LEDs. Once the colloid layer is formed or otherwise sufficiently stiff, the colloid shaping tool can be removed, leaving the colloid layer having a trapezoidal cross section on the PCB, with its side walls perpendicular to one another or said another way having slopes between the upper colloid surface and the PCB of opposing 45 degrees. Multiple shapes for the colloid layer can be achieved by modifying this technique appropriately and by using a corresponding or complementary tool. For example, the colloid layer can be configured in any shape, including having a cross section shaped as a small moon, half moon, big moon, square, rectangle, trapezoid, and so on. Exemplary cross sections are provided in FIGS. 6A-E and discussed in further detail below.

The colloid layer is typically a material that is transparent when solid and has a high tolerance for low and high temperatures, such as polyurethane resin, or any other suitable light transmissive encapsulation material. Any such waterproofing material can be used that is flexible, non-conductive, allows for a desired amount of light to be emitted from the device, and/or can tolerate extreme temperatures, for example, from −10 degrees Celsius to 40 degrees Celsius. The material can be a sheath surrounding the components, but is preferably disposed directly on the PCB, LEDs, and electrical circuit for the most protection. Optically clear materials can be used, such as silicone gels. Materials that do not degrade (or that resist discoloration) when exposed to ultra-violet (UV) light are included. Further examples include polymethlymethacrylate (PMMA), epoxy or silicone resins, polycarbonate, nylon, and silicone rubber.

If desired, the colloid layer may be colored to add or otherwise change the color of the light output from the LEDs. Likewise, the PCB can be colored to match a surface to which it is intended to be applied to camouflage or otherwise reduce the aesthetic impact an installed lighting system may have. For example, if a lighting system is to be installed on white walls, the PCB can be colored white so that when installed on the wall surface the lighting strip blends in well with its surrounding.

The lighting strips 100, 200, 300, 400 can be connected with other lighting strips 100, 200, 300, 400 by way of connectors comprising a female end 107, 207, 307, 407 and a male end 106, 206, 306, 406 for example, at opposite ends of each lighting strip 100, 200, 300, 400. When the connector 106, 206, 306, 406 of one lighting strip is joined with connector 107, 207, 307, 407 of another lighting strip, waterproof seal 108, 208, 308, 408 ensures the connection is waterproof. Connectors 106, 206, 306, 406 and 107, 207, 307, 407 are operably connected to the PCB 101, 201, 301, 401 by way of wire leads (not shown), which are operably connected to electrical contacts 105, 205, 305, 405 at either end of the PCB, wherein the wire leads are protected with insulating/waterproofing material 104, 204, 304, 404. Preferably, connectors 106, 206, 306, 406 and 107, 207, 307, 407 together with insulation 104, 204, 304, 404 seals 108, 208, 308, 408 and 110, 210, 310, 410 and coating material 103, 203, 303, 403 combine to provide waterproof protection for a flexible lighting system with multiple lighting strips 100, 200, 300, 400.

The lighting strips 100, 200, 300, 400 can also be cut at pre-determined segments to provide a length of strip that custom fits a particular application. The strips 100, 200, 300, 400 can be supplied with indicators 112, 212, 312, 412 where cutting of the strip can be performed. To maintain the waterproof characteristics of the strips once cut, a terminal end should be supplied, such as a plastic end that can be joined with the cut end of the substrate with silicone to ensure the end of the strip is waterproof. Alternatively, the substrates can comprise areas where electrical contacts can result as ends of the strips once cut and waterproof socket connectors can be provided to join two plug-type ends of strips that have been cut. To ensure the waterproof nature of strips joined in this way it would be best to seal the juncture between the ends with silicone or other waterproofing material.

The flex strips 100, 200, 300, 400 can be single- or multi-color light strips and can comprise any predetermined number of light sources 109, 209, 309, 409. Substrate or PCB 101, 201, 301, 401 comprises a flexible material. Flexible in the context of this application is that the lighting strip can conform to any surface shape to which it is intended to be installed upon. In preferred embodiments, a flexible lighting strip when held in the hand can be manipulated with very little force from the fingers or simply from gravity.

The substrate (e.g., printed circuit board or PCB) for the flexible lighting devices 100, 200 and systems according to the invention can comprise any electrically non-conductive material, such as plastic. The exact materials for the substrate are not critical and options within the skill in the art are available, so long as the substrate provides sufficient support for the components mounted to it (such as LEDs, ICs, and resistors) and the overall lighting devices 100, 200, 300, 400 are flexible and allow for the lighting strip devices 100, 200, 300, 400 to conform to various surface shapes. Such substrates 101, 201, 301, 401 are also referred to as flexible printed circuits or FPCs. The electrically conductive pathway (only partially shown) can comprise any electrically conductive material such as aluminum or copper. The conductive pathway can be affixed to the PCB 101, 201, 301, 401 by any known means available in the art, including being sandwiched between two layers of electrically non-conductive substrate.

Any light source 109, 209, 309, 409 can be used but which is usually dictated by a specific application. Appropriate light sources 109, 209, 309, 409 can include high brightness PLCC-2 SMD LEDs and PLCC-6 SMD LEDs. Likewise, 3528 SMD LEDs may be used as well as 5050 RGB SMD LEDs for particular applications.

The polyurethane resin as the colloid layer 103, 203, 303, 403 makes high brightness LEDs possible in these lighting strip applications. The polyurethane resin is capable of withstanding extreme high and low temperatures without crazing and thereby jeopardizing the waterproof nature of the strips and/or the quality of light emitted from the devices. Such SMD LEDs have a 120 degree viewing angle for even light and are available in various colors, including without limitation white (neutral, cool, and warm), red, yellow, blue, and green. The lighting strips 100, 200, 300, 400 can be constructed to comprise single-color or multi-color light source 109, 209, 309, 409 configurations. For example, the lighting strips 100, 200, 300, 400 can comprise single-color red, yellow, green, blue, cool white, neutral white, or warm white or multi-color (RGB-color) red, green, and blue colored LEDs 109, 209, 309, 409. Several color combinations are possible and within the skill of the art. In FIGS. 1A, 2A, 3A and 4A the light sources 109, 209, 309, 409 are light emitting diodes (LEDs).

At one end of the light strips shown in FIGS. 1A, 2A, 3A and 4A there is a socket-type connector 107, 207, 307, 407. The socket-type connector 107, 207, 307, 407 provides for physical connection of two lighting strips 100, 200, 300, 400 and electrical connection of the electrical circuits (not shown) of the strips 100, 200, 300, 400. The socket-type connector 107, 207, 307, 407 can be of any known connector as long as it is capable of providing both physical and electrical connection of the components and a waterproof connection of these components. The lighting strips 100, 200, 300, 400 also comprise at the opposing lengthwise end of the strip 100, 200, 300, 400 a plug-type connector 106, 206, 306, 406. The plug 106, 206, 306, 406 and socket 107, 207, 307, 407 connectors are complementary configured to provide for mating of the plug 106, 206, 306, 406 of one light strip 100, 200, 300, 400 with the socket-type end 107, 207, 307, 407 of another strip 100, 200, 300, 400. As shown in FIGS. 1A 2A, 3A, and 4A, the socket and plug can be of various configurations, including a round quick-release type plug and socket with an internal rubber gasket for maintaining the waterproof connection between the plug and socket.

The plug 106, 206, 306, 406 and socket 107, 207, 307, 407 typically comprise wire leads (not shown, but internal to insulation wrapping 104, 204, 304, 404) for soldering or otherwise adhering the electrically-conductive components of the plug 106, 206, 306, 406 and socket 107, 207, 307, 407 to the electrical circuit of the PCB 101, 201, 301, 401. The plug 106, 206, 306, 406 and socket 107, 207, 307, 407 are operably connected to the electrical circuit of the PCB when their electrical components (wire leads and electrical contacts) are capable of providing for continuity in an electrical path from the circuit of one PCB to the circuit of another PCB during use of the lighting strips. The connection between the connecting ends of the lighting strips and the PCB should be waterproof.

The lighting strips 100, 200, 300, 400 can be manufactured in 6-inch, 1-foot, or 18-inch lengths, or any length increment, including 1.6 feet, each length comprising any number of LEDs 109, 209, 309, 409. Further, especially with respect to the longer lengths, the substrate 101, 201, 301, 401 can comprise a material that provides for cutting of the flex strips 100, 200, 300, 400 typically at the time of installation, to a shorter length. In one embodiment, lighting strips 100, 200, 300, 400 can be provided in one length of 1.6 feet (or 50 cm) with 30 LEDs 109 (single color), or 18 LEDs (multi-color), which is capable of being cut into smaller segments. The strips can be joined with other strips and packaged on reels. A preferred embodiment of reels of lighting strips provides 16 feet of lighting strips (10 1.6-foot strips), which provides for a lighting system of 300 single-color LEDs or 180 multi-color LEDs. Further preferred are lighting systems comprising up to 32 feet of lighting strips, or 600 single-color LEDs or 360 multi-color LEDs. Another preferred configuration is a 5M long lighting strip, capable of being cut at indicated points, comprising 300 LEDs. One or more of the lighting strips can be joined together to form a lighting system, such as combining two 5M lengths into a lighting system that is 10M and comprises 600 LEDs.

FIGS. 1B, 3B and 2B, 4B show a top plan view of respectively a single color flexible lighting strip 100, 300 and a multi-color flex strip 200, 400. Emphasized in the cross-section A-A of these views is the low-profile capability of the lighting strips 100, 200, 300, 400. For example, the PCB 101, 201, 301, 401 and light sources 109, 209, 309, 409 when encapsulated or covered by coating material 103, 203, 303, 403 can be about 3 mm in height or less. Combining low-profile characteristics with high brightness is a challenge to LED lighting manufacturers. Typically, as brightness increases, so does the size of the LED. As a particular example, an LED that is 0.5 mm or less in height typically will not be able to output the same amount of light as an LED with a 2.5 mm profile. Thus, obtaining lighting strips which are as low-profile as possible but as bright as possible is difficult, and is further complicated by the desire to have such lighting devices be waterproof. Thus it is highly desirable to have lighting strips that are waterproof and comprise LEDs that are greater than 0.5 mm high, but less than 3 mm high. Any height LED from 1 mm, 1.5 mm, 2 mm, 2.5 mm, 2.6 mm, 3 mm, 3.5 mm, 4 mm, etc. would be possible with this invention.

Representative optical and electrical parameters for embodiments of waterproof single-color and multi-color LED flex and rigid strips according to the invention include those listed in Tables 1-7 below.

TABLE 1

Representative Optical Parameters at Ta = 77° F. of Waterproof Single-Color LED Flex Strips

| Part No. | Color | LED Quantity [pcs]/reel | Viewing angle [°] | Wavelength | Luminous flux [lm]/reel | LED Quantity [pcs]/segment |
|---|---|---|---|---|---|---|
| VO-FS-CW-12A0 | Cool white | 300 | 120 | 6000-8000k | 1800 | 6 |
| VO-FS-WW-12A0 | Warm white | 300 | 120 | 3000-3500k | 1500 | 6 |
| VO-FS-NW-12A0 | Neutral white | 300 | 120 | 4000-5000k | 1600 | 6 |
| VO-FS-R-12A0 | red | 300 | 120 | 625 nm | 600 | 6 |
| VO-FS-Y-12A0 | yellow | 300 | 120 | 590 nm | 480 | 6 |
| VO-FS-G-12A0 | green | 300 | 120 | 515 nm | 700 | 6 |
| VO-FS-B-12A0 | blue | 300 | 120 | 470 nm | 320 | 6 |
| VO-FS-R-12T1 | Red | 300 | 120 | 625 nm | 620 | 3 |
| VO-FS-Y-12T1 | Yellow | 300 | 120 | 590 nm | 550 | 3 |
| VO-FS-G-12T1 | Green | 300 | 120 | 515 nm | 470 | 3 |
| VO-FS-B-12T1 | Blue | 300 | 120 | 470 nm | 300 | 3 |
| VO-FS-CW-12T1 | Cool white | 300 | 120 | 6000-8000k | 600 | 3 |
| VO-FS-NW-12T1 | Neutral white | 300 | 120 | 4000-4500k | 550 | 3 |
| VO-FS-WW-12T1 | Warm white | 300 | 120 | 3000-3500k | 500 | 3 |
| VO-FS-R-24T1 | Red | 300 | 120 | 625 nm | 620 | 6 |
| VO-FS-Y-24T1 | Yellow | 300 | 120 | 590 nm | 550 | 6 |
| VO-FS-G-24T1 | Green | 300 | 120 | 515 nm | 470 | 6 |
| VO-FS-B-24T1 | Blue | 300 | 120 | 470 nm | 300 | 6 |
| VO-FS-CW-24T1 | Cool white | 300 | 120 | 6000-8000k | 600 | 6 |
| VO-FS-NW-24T1 | Neutral white | 300 | 120 | 4000-4500k | 550 | 6 |
| VO-FS-WW-24T1 | Warm white | 300 | 120 | 3000-3500k | 500 | 6 |

TABLE 2

Representative Electrical Parameters of
Waterproof Single-Color LED Flex Strips

| Parameters | Symbol | Values | | Unit |
|---|---|---|---|---|
| Operating Voltage | Vopr | VO-FS-R/Y/G/B/CW/NW/WW-12T1 | 12 (+5%) | V |
| Power Dissipation Max | PD | VO-FS-R/Y-12T1 | 2.2 | W |
| (V = 12 VDC) | | VO-FS-G/B/CW/WW-12T1 | 2.4 | |
| Operating Temperature | Topr | −30-+85 (−22-+185) | | °C. (°F.) |
| Storage Temperature | Tstg | −30-+85 (−22-+185) | | °C. (°F.) |
| Operating Voltage | Vopr | VO-FS-R/Y/G/B/CW/NW/WW-24T1 | 24 (+5%) | V |
| Power Dissipation Max | PD | VO-FS-R/Y-24T1 | 2.2 | W |
| (V = 24 VDC) | | VO-FS-G/B/CW/WW-24T1 | 2.4 | |
| Operating Temperature | Topr | −30-+85 (−22-+185) | | °C. (°F.) |
| Storage Temperature | Tstg | −30-+85 (−22-+185) | | °C. (°F.) |
| Operating Voltage | Vopr | VO-FS-XX (all colors)-12T5 | 24 (+5%) | V |
| Power Dissipation Max | PD | VO-FS-R/Y-12T5 | 2.2 | W |
| (V = 24 VDC) | | VO-FS-G/B/CW/NW/WW-12T5 | 2.4 | |
| Operating Temperature | Topr | −30-+50 | | °C. |
| Storage Temperature | Tstg | −30-+65 | | °C. |

The lighting strips can be cut to a desired length. Cutting marks can be provided along the length of the strips to provide convenience for cutting during an installation. After cutting a strip at the cutting mark, the ends of the strips that are exposed should be sealed with a terminal to provide waterproofing for the cut ends. As shown in FIGS. 12A-H, silicone (or other waterproofing material or adhesive) can be injected into a terminal and the strip inserted to provide a waterproof end. A similar process can also be used to join two lighting strips at their respective ends and/or in combination with a plastic sleeve to house the ends.

Lighting strip embodiments of the invention can be connected through DC 2.1 or through wires to the power supply.

TABLE 3

Representative Optical Parameters at Ta = 77° F. of Waterproof Multi-Color LED Flex Strips

| Part No. | LED Color | LED Quantity [pcs]/reel | Viewing angle [°] | Wavelength [nm] | Luminous flux [lm]/strip | LED Quantity [pcs]/segment |
|---|---|---|---|---|---|---|
| VO-FS-RGB-12T1 | Red | 18 | 120 | 630 | 9 | 3 |
| | Green | | | 520 | 23 | |
| | Blue | | | 468 | 6.5 | |
| VO-FS-RGB-24T1 | Red | 18 | 120 | 630 | 9 | 6 |
| | Green | | | 520 | 23 | |
| | Blue | | | 468 | 6.5 | |

TABLE 4

Representative Electrical Parameters of
Waterproof Multi-Color LED Flex Strips

| Parameters | Symbol | Values | | Unit |
|---|---|---|---|---|
| Operating Voltage | Vopr | 12 (+5%) | | V |
| Power Dissipation | PD | Red | 1.2 | W |
| Max. (V = 12 VDC) | | Green | 1.0 | |
| | | Blue | 1.0 | |
| | | Total | 3.2 | |
| Operating Temperature | Topr | −30-+85 (−22-+185) | | °C. (°F.) |
| Storage Temperature | Tstg | −30-+85 (−22-+185) | | °C. (°F.) |
| Operating Voltage | Vopr | 24 (+5%) | | V |
| Power Dissipation | PD | Red | 1.2 | W |
| Max. (V = 24 VDC) | | Green | 1.0 | |
| | | Blue | 1.0 | |
| | | Total | 3.2 | |

TABLE 4-continued

Representative Electrical Parameters of
Waterproof Multi-Color LED Flex Strips

| Parameters | Symbol | Values | Unit |
|---|---|---|---|
| Operating Temperature | Topr | −30-+85 (−22-+185) | °C. (°F.) |
| Storage Temperature | Tstg | −30-+85 (−22-+185) | °C. (°F.) |

Additionally, the lighting strips of all embodiments of the invention can be configured to be cut at predetermined intervals to provide the desired number of light sources or the desired length of lighting materials for a particular application. Exemplary positions where the strips 100, 200, 300, 400 may be cut are provided at cut indicators. Cut indicators can be markings on the substrate to indicate where a cut may be made. Further for example, in particular embodiments, the lighting strips 100, 200, 300, 400 can be configured with cut indicators that provide for the substrate strip 101, 201, 301, 401 to be cut into strips comprising 3 or 6 LEDs 109, 209, 309, 409 if desired, or any number appropriate for a specific application.

Any of the lighting strips 100, 200, 300, 400 of embodiments of the invention can further comprise an adhesive (not shown) for mounting the lighting strips 100, 200, 300, 400 to a surface. For example, the adhesive can be applied to the bottom surface of the lighting strips 100, 200, 300, 400 and temporarily protected with tape which can be removed at the time of installation to expose the adhesive.

The flex strips 100, 200, 300, 400 can comprise any number of LEDs 109, 209, 309, 409 such as 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 or more, with 3, 6, 9, or 18 preferred. Indeed, any number of LEDs 109, 209, 309, 409 can be used for each flex strip 100, 200.

Figure 5A:
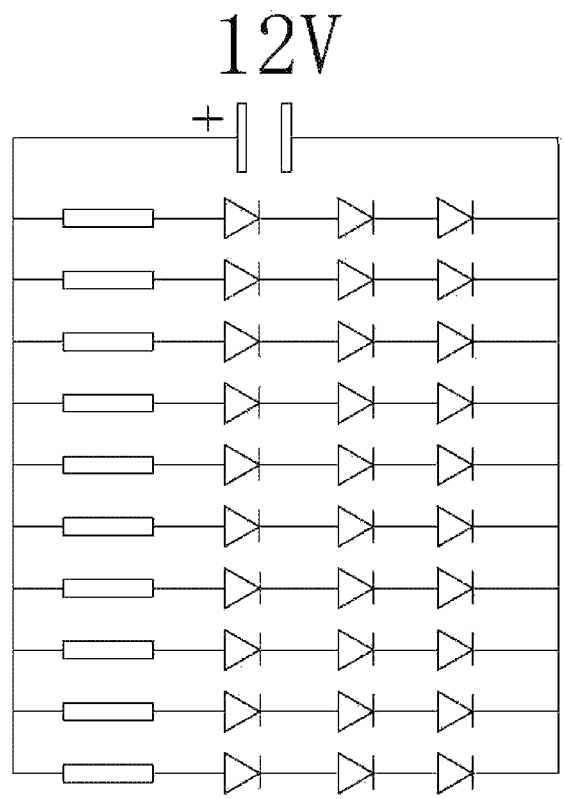
FIGS. 5A-G are graphic representations of circuits for various embodiments of the flexible lighting strips according to the invention.
Figure 5B:
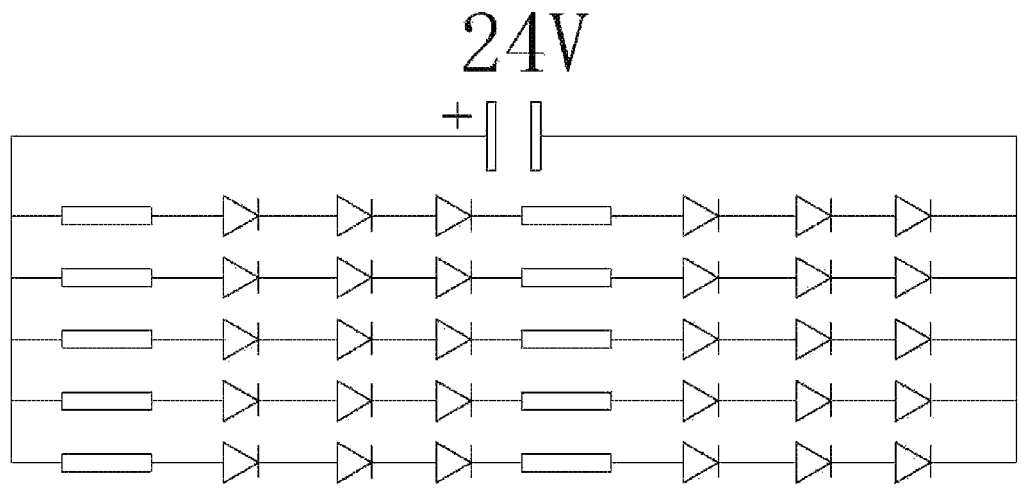
Figure 5C:
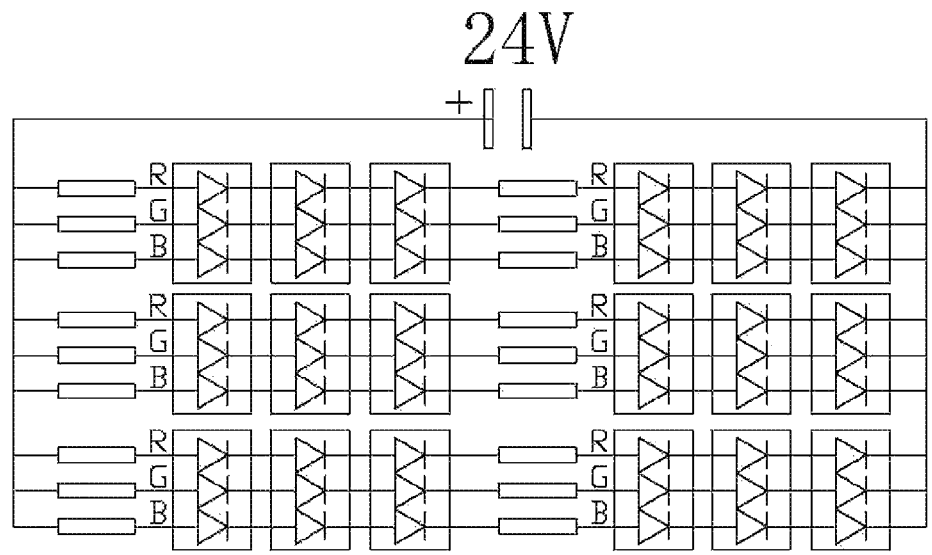
Figure 5D:
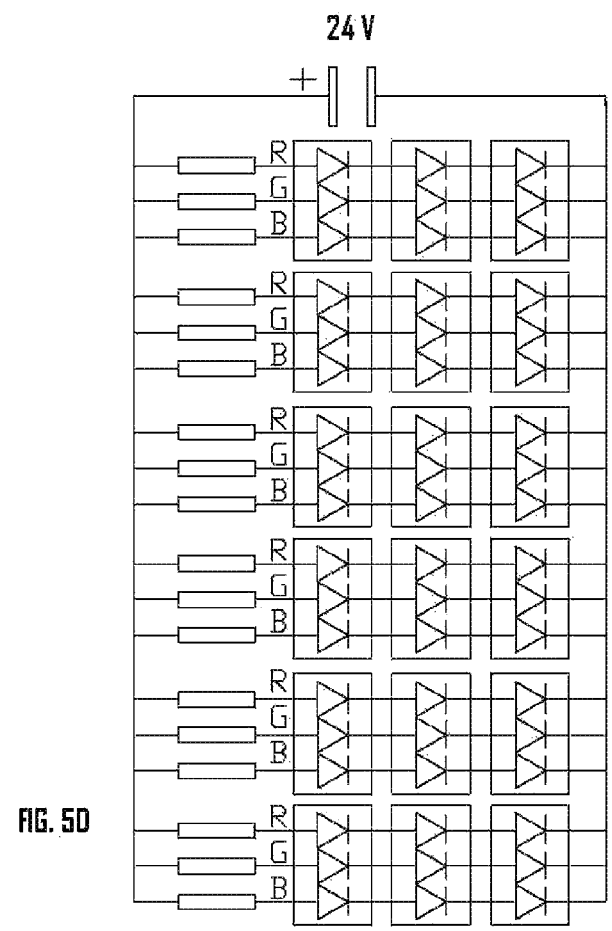
Figure 5E:
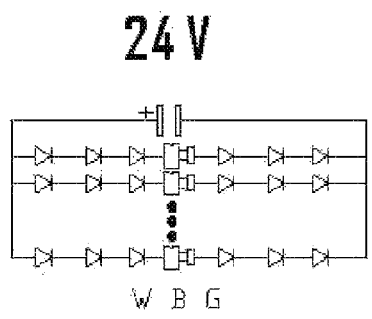
Figure 5F:
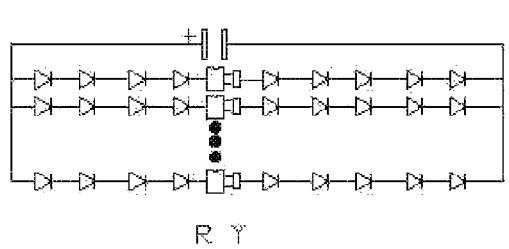
Figure 5G:
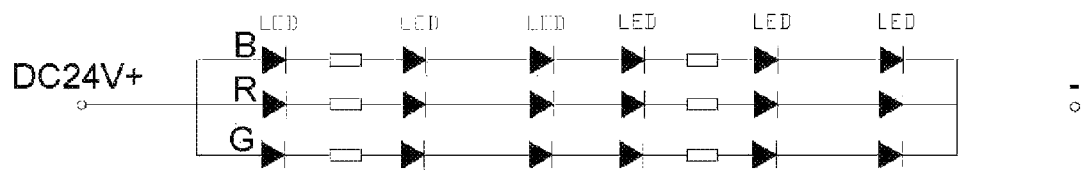

FIGS. 5A-G provide representative circuits for embodiments of the flex strips according to the invention. More particularly, FIGS. 5A and 5B illustrate an exemplary electrical circuit configuration for the flex strip embodiments shown in FIGS. 1A and 1B. FIGS. 5C and 5D illustrate an exemplary circuit for the flexible lighting shown in FIGS. 2A and 2B. Further, the schematic electrical circuits shown in FIGS. 5E and 5F provide one design for the lighting strips shown in FIGS. 3A and 3B. Even further, the circuit schematic provided in FIG. 5G illustrates one way of configuring the lighting strip of FIGS. 4A and 4B.

Figure 6A:
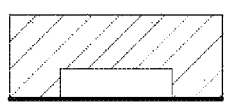
FIGS. 6A-E are schematic diagrams of cross sections of various waterproof flexible lighting strips of the invention.
Figure 6B:
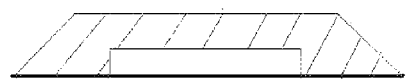
Figure 6C:
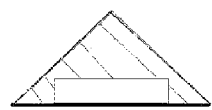
Figure 6D:
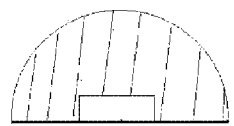
Figure 6E:
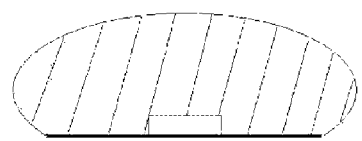
Figure 7B:
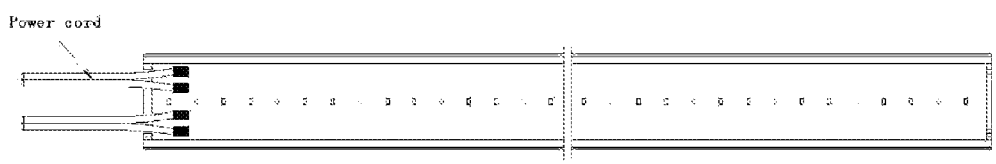
Figure 7C:
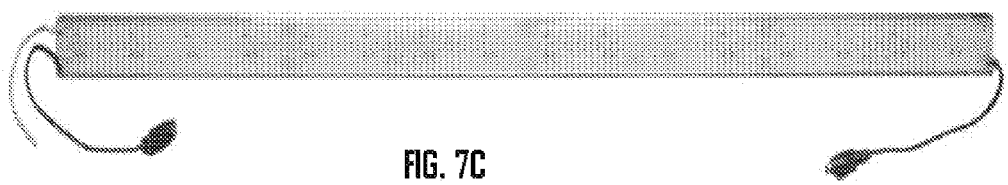
Figure 7D:
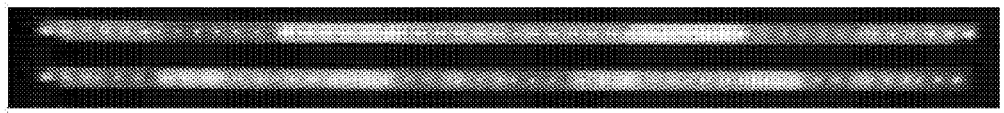
Figure 7E:
Figure 8A:
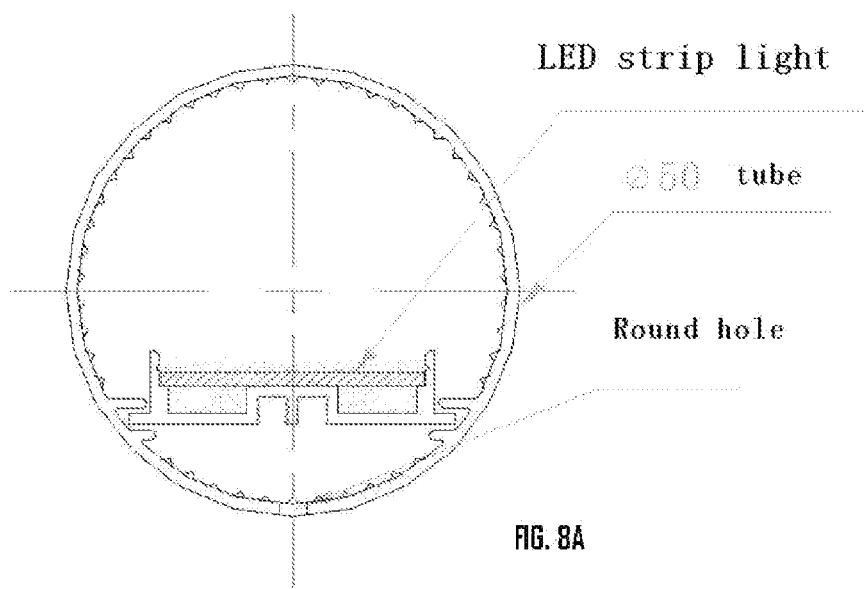
Figure 8B:
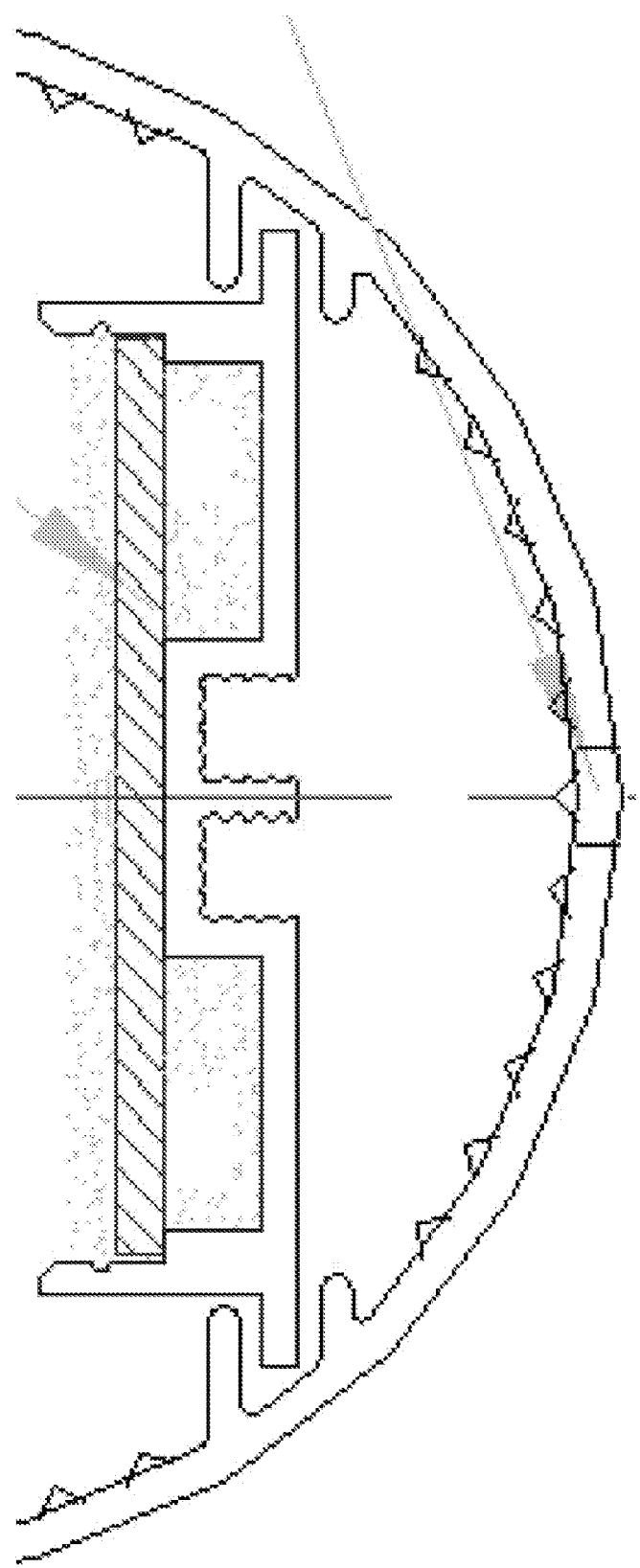
Figure 8D:
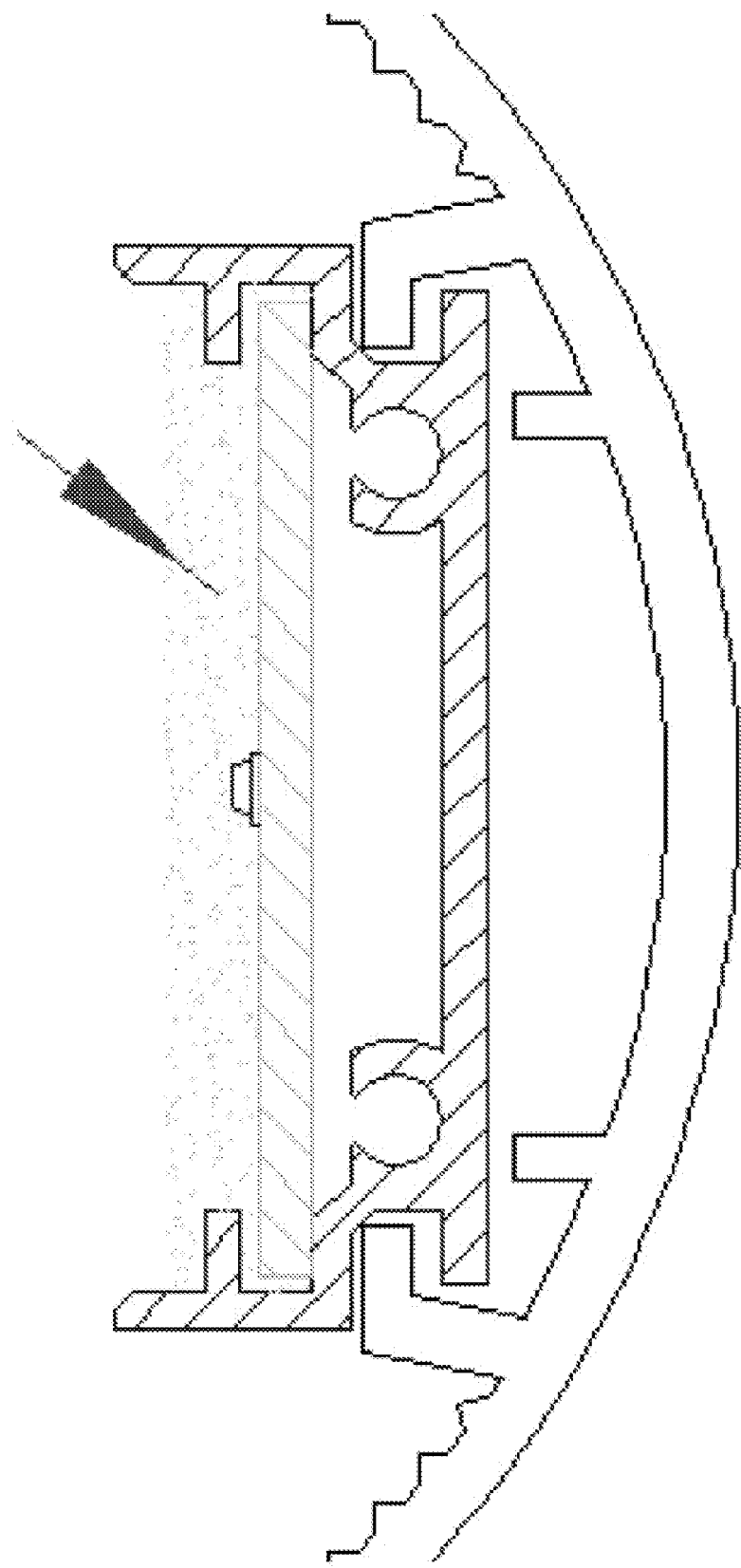

FIGS. 6A-E provide schematic diagrams illustrating various examples of lighting strip embodiments of the invention. As shown, FIG. 6A provides a cross section of a lighting strip with a rectangular or square profile. Such a lighting strip can be manufactured by preparing a mold (two elongated planar supports) generally perpendicular to the sides of the PCB substrate to hold the colloid material in place for a sufficient amount of time to provide a square or rectangular shaped profile upon removal from the mold. Likewise, as shown in FIG. 6B, a generally trapezoidal shaped lighting strip can be formed by using two elongated and substantially planar supports disposed at an acute angle with respect to the PCB. Further, a triangular cross section can be achieved by placing elongated supports along the sides of the PCB at a desired angle to the PCB and the entire area between the supports and the PCB filled with the colloidal material, as provided in FIG. 6C. Even further, circular and elliptical shaped colloidal materials can be formed by using a corresponding mold to achieve such a configuration, as shown respectively in FIGS. 6D and 6E.

FIGS. 7A-E provide schematic diagrams and photographs of various waterproof rigid lighting strips according to embodiments of the invention.

Cross-sectional views of yet additional embodiments of rigid lighting strips are provided in FIGS. 8A-D. Such T-tube type bulbs can be provided with waterproof or non-waterproof configurations.

Figure 9A:
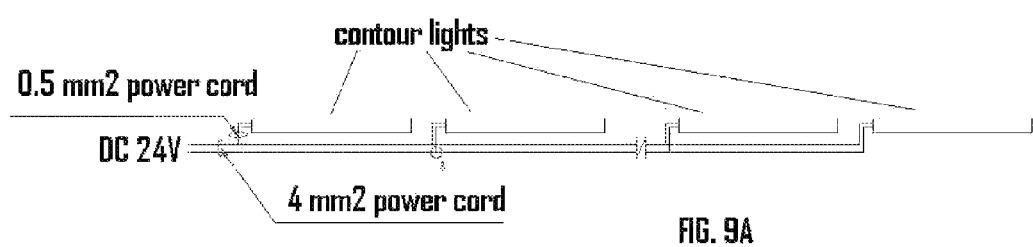
FIGS. 9A and 9B are schematic diagrams showing an example of a lighting system of the present invention and a method for installing a plurality of lighting strips.
Figure 9B:
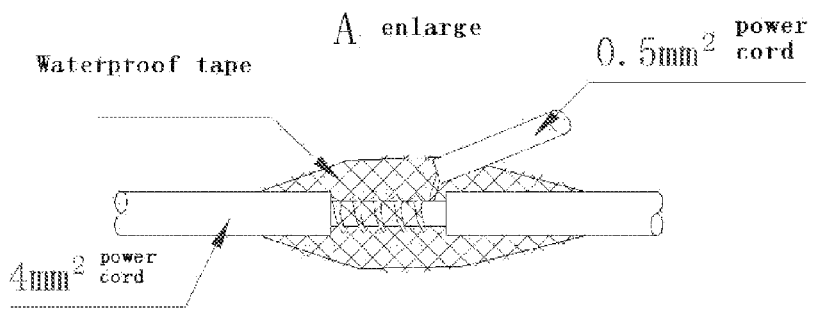

FIGS. 9A and 9B show an example of a lighting system of the present invention and a method for installing a plurality of lighting strips.

Figure 10A:
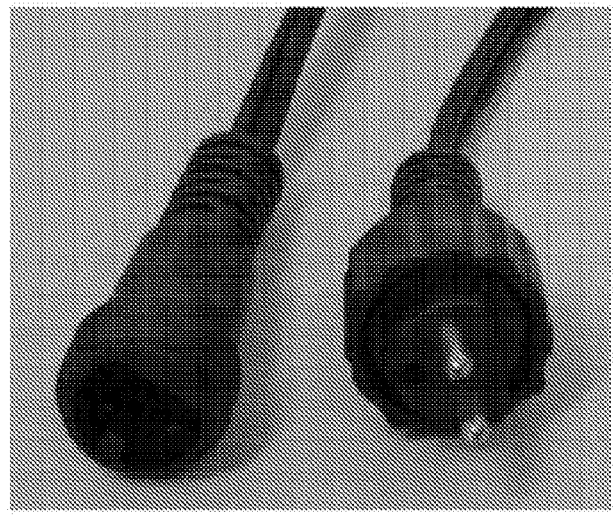
FIGS. 10A-E are photographs of various flexible waterproof lighting strips according to embodiments of the invention, showing representative connectors.
Figure 10B:
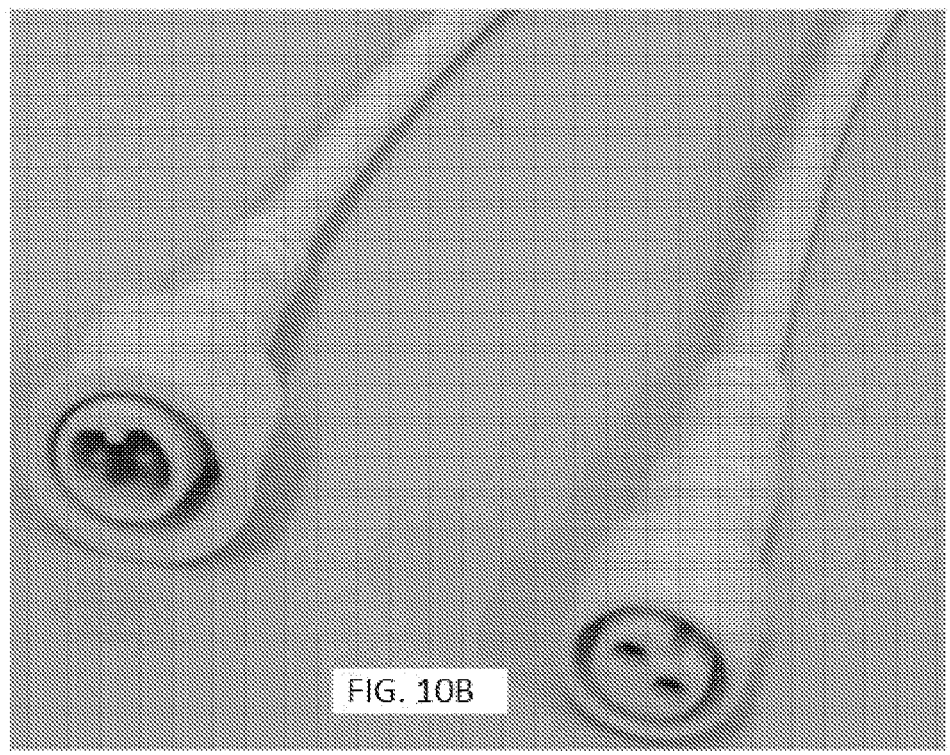
Figures 10C, 10D:
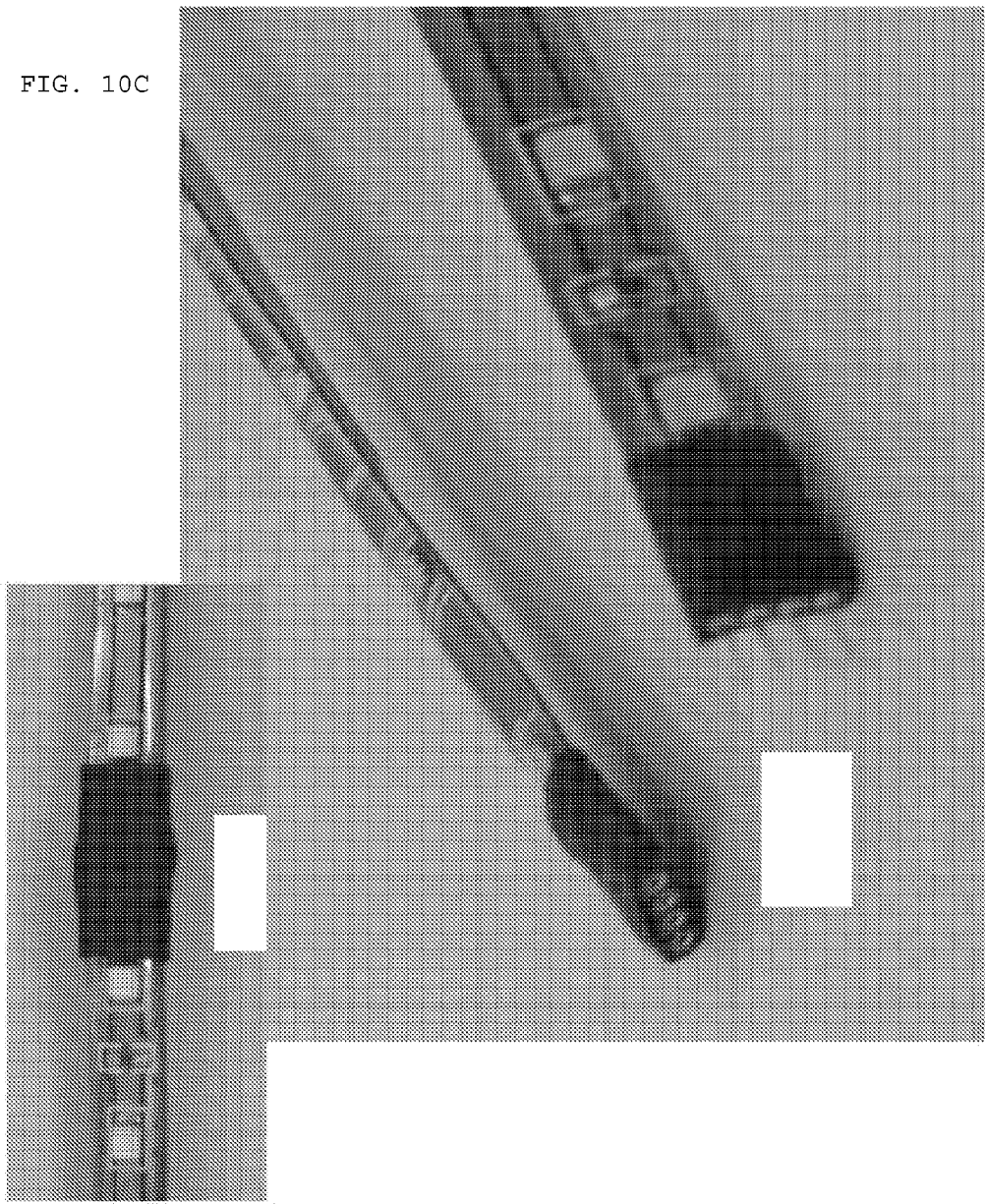
Figure 10E:
Figure 12A:
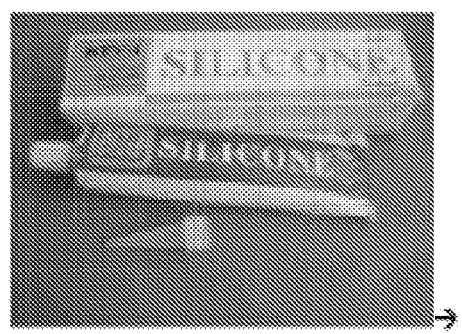
FIGS. 12A-H show a method for waterproofing (e.g., a terminal end) a lighting system embodiment of the invention.
Figure 12B:
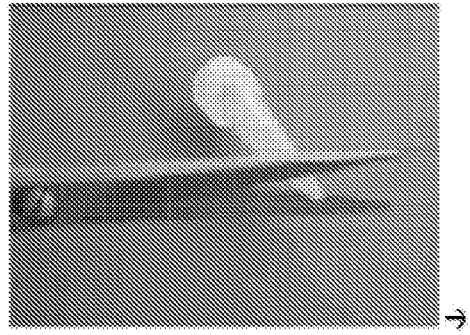
Figure 12C:
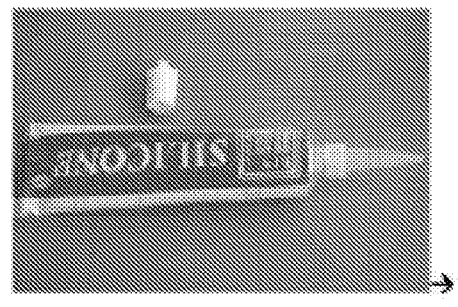
Figure 12D:
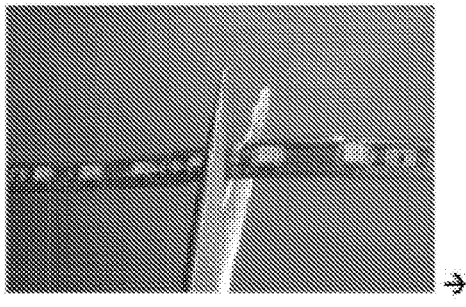
Figure 12E:
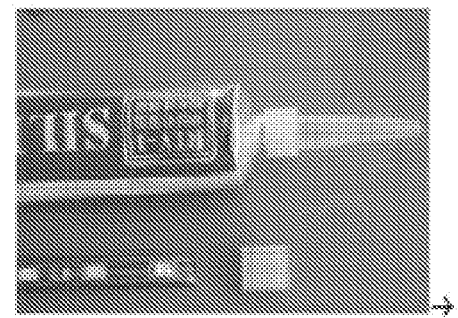
Figure 12F:
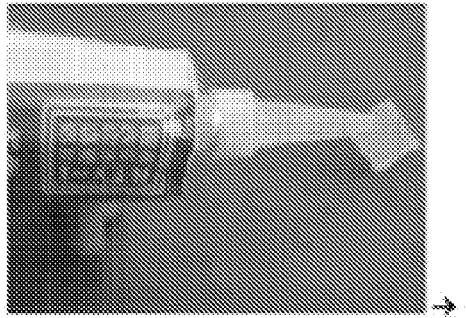
Figure 12G:
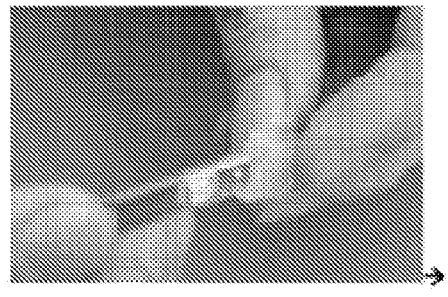
Figure 12H:

Further, as shown in FIGS. 10A and 10B, the plug/socket connection can be performed in part by a friction fit between the corresponding electrical components of the plug and corresponding socket and/or by a screw-type connection. Even further, as shown in FIGS. 10C, 10D and 10E the connection between the plug and socket can be configured to be a latchless type connection, where the components are held together by insertion of the male electrical components into the corresponding female components. A protective sleeve can also be installed over the connection between two strips alone or in combination with additional waterproofing material, such as silicone gel to fill in any gaps.

Packaging of the flexible lighting strips can be performed in any conventional way known or available to those of skill in the art. For example, ten strips (16 ft) can be packaged in a reel in an anti-static bag. Such an embodiment is shown in FIG. 11A. Two lighting strips packaged on reels may be connected using their waterproof connectors, as shown unconnected (FIG. 11B) and connected (FIG. 11C).

FIGS. 12A-H show a method for waterproofing according to an embodiment of the invention. In particular, as shown silicone gel (or other waterproofing material) can be used to connect a plastic sleeve to a terminal end of a flexible lighting strip of the invention. Such a sleeve could also be used over and encompassing two ends of lighting strips to be joined together by electrical connectors to ensure the waterproof connection.

FIGS. 13A-E show various views of a waterproof lighting system according to the invention. In this embodiment, high brightness 0.5 W SMD PLCC-6 LEDs can be used for the light sources 1502. The LEDs 1502 are mounted to a substrate 1501, which is supported by support 1515. Lighting strips 1500 of this embodiment can be of any length, with 1-, 2-, or 3-foot segments being preferred. The strips 1500 are connected to a power source by wire leads 1509, which exit the lighting strip at hole 1520. A waterproofing substance 1523, as shown in FIGS. 13C and 13D, can fill the area around the LEDs 1502, either partially or completely covering the sides and/or upper surface of the LED. The wire leads 1509 can comprise insulation or other waterproofing material to completely fill the hole 1520 and thereby waterproof the strip 1500. The lighting strips can be mounted to a surface by way of holes 1521 in support 1522, through which screws or any other attaching mechanism can be used. Substrate 1501 can be secured to housing 1515 by way of screws 1514.

Figure 14:
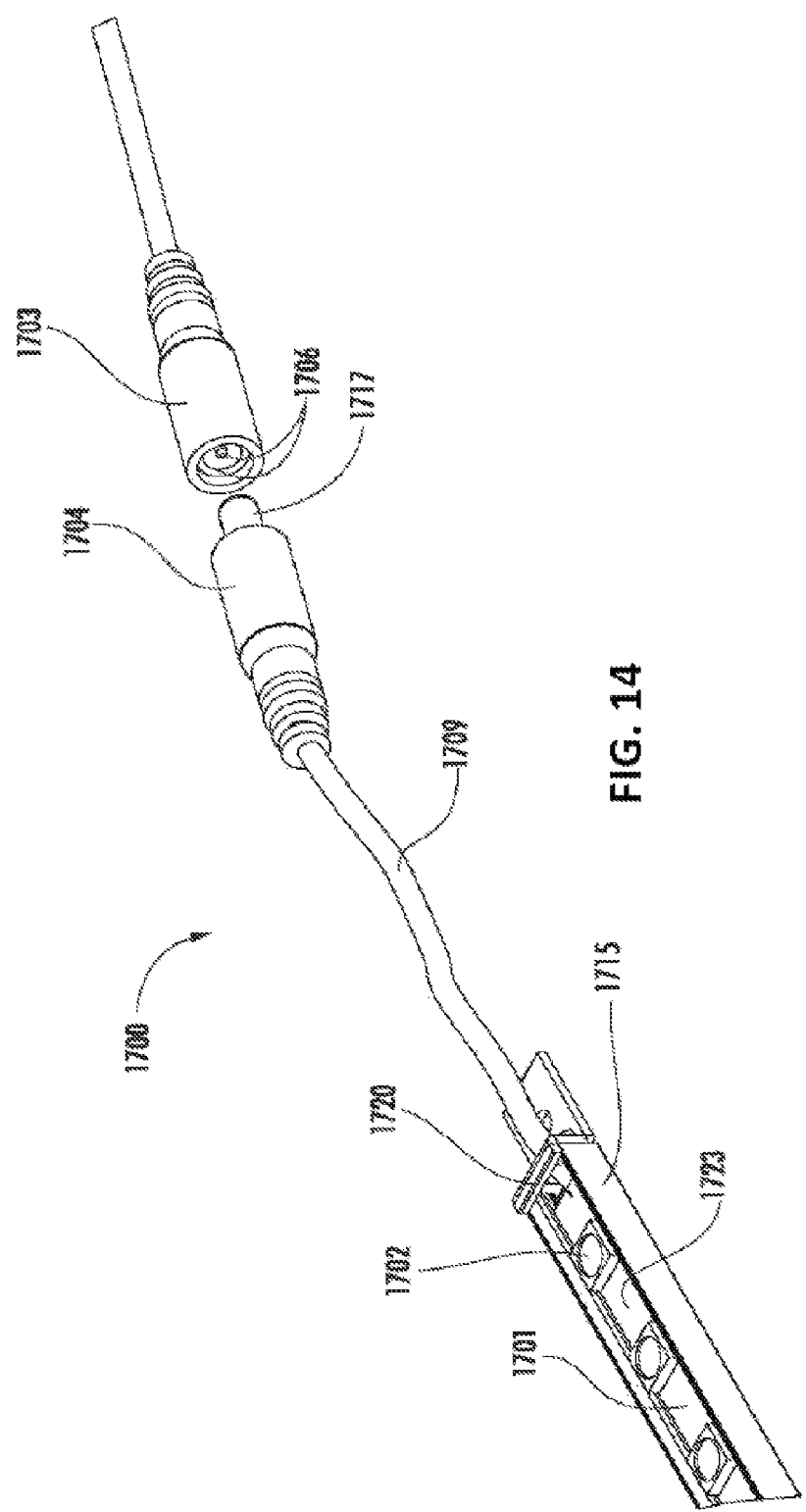
FIG. 14 shows another waterproof embodiment of rigid lighting strips.

FIG. 14 shows another waterproof embodiment similar to that shown in FIGS. 13A-E. Here, lighting strip 1700 comprises a housing 1715 for supporting substrate 1701. Mounted onto substrate 1701 are at least one LED 1702. Insulated wire leads 1709 are attached to the substrate 1701 in an operable fashion to permit the flow of electricity from the power source through the circuit of the PCB, through wire leads at the opposing end of strip 1700, and into a subsequent lighting strip 1700 operably connected in the lighting strip series. Socket-type end 1703 comprises structure 1706 for engaging and operably connecting with complementary structure 1717 of plug-type end 1704. The connectors 1703, 1704 in this embodiment provide for a waterproof, releasable engagement with a friction-fit. Additionally, waterproofing material 1723 is added to lighting strip 1700 to cover the LEDs 1702 and substrate 1701 and fill the holes 1720 through which wire leads 1709 exit the lighting strip 1700. The waterproofing material can be a resin or epoxy or any suitable material that does not interfere with operation of the light sources 1702, e.g., transparent.

Representative optical and electrical parameters for embodiments of waterproof single color LED hard strips according to the invention include:

TABLE 5

Representative Optical Parameters at Ta = 77° F. of Waterproof Single-Color LED Rigid Strips

| Part No. | Color | Size (mm) | PCS Size (mm) | Lumens (lm) | Wavelength | LEDs | Segment | View Angle |
|---|---|---|---|---|---|---|---|---|
| VO-HS-R-12T1 | Red | 1000 × 12 × 10 | 1000 × 10 × 1.0 | 300 | 624 nm | 60 | 1 | 120 |
| VO-HS-Y-12T1 | Yellow | 1000 × 12 × 10 | 1000 × 10 × 1.0 | 300 | 590 nm | 60 | 1 | 120 |
| VO-HS-G-12T1 | Green | 1000 × 12 × 10 | 1000 × 10 × 1.0 | 400 | 515 nm | 60 | 1 | 120 |

TABLE 5-continued

Representative Optical Parameters at Ta = 77° F. of Waterproof Single-Color LED Rigid Strips

| Part No. | Color | Size (mm) | PCS Size (mm) | Lumens (lm) | Wavelength | LEDs | Segment | View Angle |
|---|---|---|---|---|---|---|---|---|
| VO-HS-B-12T1 | Blue | 1000 × 12 × 10 | 1000 × 10 × 1.0 | 200 | 470 nm | 60 | 1 | 120 |
| VO-HS-CW-12T1 | Cool white | 1000 × 12 × 10 | 1000 × 10 × 1.0 | 600 | 5000-10000K | 60 | 1 | 120 |
| VO-HS-NW-12T1 | Neutral white | 1000 × 12 × 10 | 1000 × 10 × 1.0 | 550 | 3700-5000K | 60 | 1 | 120 |
| VO-HS-WW-12T1 | Warm white | 1000 × 12 × 10 | 1000 × 10 × 1.0 | 500 | 2600-3700K | 60 | 1 | 120 |
| VO-HS-R-24T1 | Red | 1000 × 12 × 10 | 1000 × 10 × 1.0 | 300 | 624 nm | 60 | 1 | 120 |
| VO-HS-Y-24T1 | Yellow | 1000 × 12 × 10 | 1000 × 10 × 1.0 | 300 | 590 nm | 60 | 1 | 120 |
| VO-HS-G-24T1 | Green | 1000 × 12 × 10 | 1000 × 10 × 1.0 | 400 | 515 nm | 60 | 1 | 120 |
| VO-HS-B-24T1 | Blue | 1000 × 12 × 10 | 1000 × 10 × 1.0 | 200 | 470 nm | 60 | 1 | 120 |
| VO-HS-CW-24T1 | Cool white | 1000 × 12 × 10 | 1000 × 10 × 1.0 | 600 | 5000-10000K | 60 | 1 | 120 |
| VO-HS-NW-24T1 | Neutral white | 1000 × 12 × 10 | 1000 × 10 × 1.0 | 550 | 3700-5000K | 60 | 1 | 120 |
| VO-HS-WW-24T1 | Warm white | 1000 × 12 × 10 | 1000 × 10 × 1.0 | 500 | 2600-3700K | 60 | 1 | 120 |
| VO-HS-R-24T1-101 | Red | 990 × 24 × 8 | | 96 | 624 nm | 48 | 1 | 120 |
| VO-HS-Y-24T1-101 | Yellow | 990 × 24 × 8 | | 96 | 590 nm | 48 | 1 | 120 |
| VO-HS-G-24T1-101 | Green | 990 × 24 × 8 | | 96 | 515 nm | 48 | 1 | 120 |
| VO-HS-B-24T1-101 | Blue | 990 × 24 × 8 | | 40 | 470 nm | 48 | 1 | 120 |
| VO-HS-CW-24T1-101 | Cool white | 990 × 24 × 8 | | 96 | 5000-10000K | 48 | 1 | 120 |
| VO-HS-NW-24T1-101 | Neutral white | 990 × 24 × 8 | | 80 | 3700-5000K | 48 | 1 | 120 |
| VO-HS-WW-24T1-101 | Warm white | 990 × 24 × 8 | | 80 | 2600-3700K | 48 | 1 | 120 |

TABLE 6

Representative Electrical Parameters of Waterproof Single-Color LED Rigid Strips

| Parameters | Symbol | Values | Unit |
|---|---|---|---|
| Operating Voltage | Vopr | 12 (+/−5%) | V |
| Power Dissipation Max. (V = 12 VDC) | PD | Red/Yellow 2.5 G/B/CW/NW/WW 3.5 | W |
| Operating Temperature | Topr | −30-+85 (−22-+185) | ° C. (° F.) |
| Storage Temperature | Tstg | −30-+85 (−22-+185) | ° C. (° F.) |
| Operating Voltage | Vopr | 12 (+/−5%) | V |
| Forward Current | $I_F$ | 200 | mA |
| Power Dissipation Max. (V = 12 VDC) | PD | 4.8 | W |
| Operating Temperature | Topr | −20-+50 (−4-+122) | ° C. (° F.) |
| Storage Temperature | Tstg | −20-+75 (−4-+167) | ° C. (° F.) |

TABLE 7

Representative Optical Parameters at Ta = 77° F. of Waterproof Multi-Color LED Rigid Strips

| Part No. | Color | Size (mm) | Lumens (lm) | VDC | Power (W) | LEDs | Segment | View Angle |
|---|---|---|---|---|---|---|---|---|
| VO-HS-RGB-24T1-201 | RGB | 990 × 24 × 8.2 | 96 | 24 | 9.6 | 48 | 1 | 120 |
| VO-HS-RGB-24T1-208 | RGB | 990 × 36 × 9 | 96 | 24 | 9.6 | 48 | 1 | 120 |
| VO-HS-RGB-24T1-408 | RGB | 990 × 36 × 9 | 96 | 24 | 9.6 | 48 | 1 | 120 |
| VO-HS-RGB-12T1-216 | RGB | 990 × 36 × 9 | 40 | 12 | 9.6 | 48 | 1 | 120 |
| VO-HS-RGB-12T1-416 | RGB | 990 × 36 × 9 | 96 | 12 | 9.6 | 48 | 1 | 120 | mentary mating receptacle to accept either the socket or plug-type end of the lighting strip system.

The lighting devices of the present invention can be dimmable and/or programmable so as to provide color mixing, a chasing circuit, flashing, etc. Further, the light strips can operate at voltages of 12 or 24 VDC. To keep the electrical current consistent during operation, integrated circuits, transistors, and/or resistors can be used. For example, with the 24 VDC flex strips, integrated circuits (ICs) can be used, typically incorporated onto the PCB at predetermined intervals between the LEDs. In one embodiment of the 24 VDC flex strips, one IC can be used for every 6 LEDs. Likewise, for example, resistors can be used with the 12 VDC flex strips.

The lighting systems and strip lighting devices of the present invention are useful in many applications where strip-type lighting can be used. For example, the lighting devices Components of the lighting systems can comprise means for connecting the substrates to a power source (not shown) for providing power to the LEDs by way of the electrically conductive pathways incorporated into or onto the PCBs. The connection to the power source can be made by way of wire leads that can be permanently secured to a PCB (with or without LEDs) and the power source. Likewise, the connection can be made by having a power source with a compleand systems according to the invention can be used in any residential or commercial application where such lighting is desired for decoration, backlighting or functional lighting, including for aisle, path, and contour lighting, such as in theatres, hospitals, airplanes, concert halls, stadiums, and auditoriums; elegant interior decoration, such as in restaurants, nightclubs, casinos, piers, malls, streets, stations, stages, offices and lobbies; homes, including as accent lighting in living rooms, under cabinet lighting in kitchens, backlighting in display cases and shelving systems, functional and decorative lighting in entryways and recreational rooms; seasonal applications, such as for holiday decorations or landscape lighting; automobiles; architectural lighting, even including tent or canopy lighting; signal lighting; and backlighting larger size signs. The applications mentioned are merely representative of the numerous applications for which the lighting systems and strip lighting devices of the present invention may be applicable.

The present invention has been described with reference to particular embodiments having various features. It will be apparent to those skilled in the art that various modifications and variations can be made in the practice of the present invention without departing from the scope or spirit of the invention. One skilled in the art will recognize that these features may be used singularly or in any combination based on the requirements and specifications of a given application or design. Other embodiments of the invention will be apparent to those skilled in the art from consideration of the specification and practice of the invention. It is intended that the specification and examples be considered as exemplary in nature and that variations that do not depart from the essence of the invention are intended to be within the scope of the invention.

The invention claimed is:

1. A modular lighting strip comprising:
a non-conductive substrate strip comprising an electrical circuit;
a plurality of high brightness LEDs operably connected to the electrical circuit;
a plug at one end and a socket at an opposing end of the substrate, each connected to the electrical circuit by soldering and providing for a waterproof or water-resistant electrical interconnection of two or more circuits when the plug or socket of one strip is connected with the socket or plug of another strip; and
a water-proof or water-resistant colloid layer disposed partially or completely over the substrate, the circuit, and the LEDs and covering the soldering.

2. The lighting strip of claim 1, wherein the colloid layer is a polyurethane resin.

3. The lighting strip of claim 2, wherein the substrate strip is rigid and the colloid layer provides a waterproof cover for the strip by being disposed in a manner to completely cover any exposed upper surface area of the non-conductive substrate strip, to completely cover any exposed electrical circuit, and to partially cover the LEDs up to and excluding an upper surface of the LEDs.

4. The modular lighting strip of claim 2, wherein the substrate strip is flexible and the colloid layer provides a waterproof cover for the strip by encapsulating an upper surface of the non-conductive substrate strip, any exposed electrical circuit, and the LEDs in their entirety.

5. The modular lighting strip of claim 4 operatively configured for cutting into smaller segments and for providing for a terminal end capable of being waterproofed or for providing an end capable of being operatively connected with another lighting strip.

6. The modular lighting strip according to claim 4 having a height between about 1 mm and 3 mm.

7. A modular lighting system comprising:
a plurality of modular lighting strips according to claim 4; and
means for operably connecting a modular lighting strip to an electrical power supply for providing power to the light sources.

* * * * *